(12) United States Patent
Sloss et al.

(10) Patent No.: US 11,017,140 B1
(45) Date of Patent: May 25, 2021

(54) AUTONOMOUS VERIFICATION OF CIRCUIT DESIGN FOR COMPUTING DEVICES

(71) Applicant: Arm Limited, Cambridge (GB)

(72) Inventors: Andrew Neil Sloss, Kirkland, WA (US); Christopher Neal Hinds, Austin, TX (US); Hannah Marie Peeler, Austin, TX (US); Gary Dale Carpenter, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/836,851

(22) Filed: Mar. 31, 2020

(51) Int. Cl.
*G06F 30/3323* (2020.01)
*G06F 9/30* (2018.01)

(52) U.S. Cl.
CPC ...... *G06F 30/3323* (2020.01); *G06F 9/30134* (2013.01)

(58) Field of Classification Search
CPC ............. G06F 30/3323; G06F 9/30134
USPC ........................................ 716/107
See application file for complete search history.

(56) References Cited

U.S. PATENT DOCUMENTS

| | | | | |
|---|---|---|---|---|
| 7,350,180 | B1* | 3/2008 | Slavin | G06F 30/30 716/103 |
| 9,996,328 | B1* | 6/2018 | Kluss | G06F 21/577 |
| 2005/0183073 | A1* | 8/2005 | Reynolds | G06F 8/30 717/141 |
| 2020/0042662 | A1* | 2/2020 | Krieg | G01R 31/318357 |

OTHER PUBLICATIONS

Fenton et al., PonyGE2: Grammatical Evolution in Python, Proceedings of GECCO 17 Companion, Berlin, Germany, pp. 1-13 (Year: 2017).*
Application, App. No. PCT/EP2021/025119, filed Mar. 29, 2021, 108 Pages.
Notification of the International Application No. and of the International Filing Date, App. No. PCT/EP2021/025119, dated Apr. 20, 2021, 10 Pages.
Notification of Receipt of Search, App. No. PCT/EP2021/025119 dated Apr. 22, 2021, 1 Page.
Notification Concerning Submission Obtention or Transmittal of Priority Document, App. No. PCT/EP2021/025119, dated Apr. 23, 2021, 1 Page.
Application, App. No. PCT/EP2021/025123, Filed Mar. 30, 2021, 149 Pages.
Notification of Receipt of Search, App. No. PCT/EP2021/025123, dated Apr. 22, 2021, 1 Page.
Notification of the International Application No. and of the International Filing Date, App. No. PCT/EP2021/025123, dated Apr. 20, 2021, 10 Pages.
Notification Concerning Submission Obtention or Transmittal of Priority Document, App. No. PCT/EP2021/025123, dated Apr. 26, 2021, 1 Page.

* cited by examiner

*Primary Examiner* — Suresh Memula
(74) *Attorney, Agent, or Firm* — Berkeley Law & Technology Group, LLP

(57) ABSTRACT

Briefly, example methods, apparatuses, and/or articles of manufacture are disclosed that may be implemented, in whole or in part, using one or more computing devices to facilitate and/or support one or more operations and/or techniques for autonomous verification of circuit design for IoT-type devices, which may include, for example, IoT-type devices operating in resource constrained or like environments.

20 Claims, 14 Drawing Sheets

```
<case_statement> ::= <case_keyword>'
('<case_expression>')'{:}<case_item>{::}<case_item>{::}<case_item>{::}<case_item_option>{::}<default_c
ase_item>:}'endcase'
<case_keyword> ::= 'case'|'casez'|'casex'
<case_expression> ::= <expression>
<case_item> ::= <case_item_expression>' : '<statement_or_null>
<case_item_option> ::= '|'<case_item>{::}<case_item_option>
<default_case_item> ::= 'default : '<statement>
<expression> ::= <primary>|<unary_operator><primary>
    |<expression_without_more><binary_operator><expression_without_more>|'('<operator_assi
gnment>')'|<conditional_expression>
<expression_without_more> ::= <primary>|<unary_operator><primary>
    |'('<operator_assignment>')'|<conditional_expression>
<expression_without_operator> ::= <primary>|<unary_operator><primary>
    |<expression_without_operator_more><binary_operator><expression_without_operator_more
>|<conditional_expression_no_operator>
<expression_without_conditional> ::= <primary>|<unary_operator><primary>
    |<expression_without_conditional_more><binary_operator><expression_without_conditional_
more>
<expression_without_operator_conditional> ::= <primary>|<unary_operator><primary>
    |<expression_without_operator_conditional_more><binary_operator><expression_without_op
erator_conditional_more>
<expression_without_operator_more> ::= <primary>|<unary_operator><primary>
    |<conditional_expression_no_operator_more>
<expression_without_conditional_more> ::= <primary>|<unary_operator><primary>
<expression_without_operator_conditional_more> ::= <primary>|<unary_operator><primary>
<case_item_expression> ::= <expression>
<comma_case_item_expression_option> ::= '|', '<case_item_expression>|',
'<case_item_expression><comma_case_item_expression_option>
<statement_or_null> ::= <statement>
<primary> ::= <primary_literal>
<unary_operator> ::= '+'|'-'|'!'|'~'|'&'|'|'~&'|'|'|'~|'
<operator_assignment> ::= <variable_lvalue><assignment_operator><expression_without_operator>
<conditional_expression> ::=
<cond_predicate>'?'<expression_without_conditional>':'<expression_without_conditional>
<conditional_expression_no_more> ::=
<cond_predicate>'?'<expression_without_conditional_more>':'<expression_without_conditional_more>
<conditional_expression_no_operator> ::=
<cond_predicate>'?'<expression_without_operator_conditional>':'<expression_without_operator_condi
tional>
```

```
<conditional_expression_no_operator_more> ::=
<cond_predicate>'?'<expression_without_operator_conditional_more>':'<expression_without_operator
_conditional_more>
<statement> ::= <statement_item>
<primary_literal> ::= <number>
<variable_lvalue> ::= '{x}'
<assignment_operator> ::= '='|'+='|'-='|'*='|'/='|'%='|'&='|'|='|'^='|'<<='|'>>='|'<<<='|'>>>='
<cond_predicate> ::= <expression_or_cond_pattern><and_expression_or_cond_pattern_option>
<statement_item> ::= <blocking_assignment>' ;'|
<procedural_continuous_assignment>' ;'|<case_statement>|<conditional_statement>| <seq_block>
<block_identifier> ::= <identifier>
<number> ::= <integral_number>|<real_number>
<comma_expression_option> ::= ''|', '<expression><comma_expression_option>
<casting_type> ::= <simple_type>|<constant_primary>|<signing>|'string'|'const'
<assignment_pattern_expression_type> ::= <integer_atom_type>
<comma_variable_lvalue_option> ::=
''|','<variable_lvalue>|','<variable_lvalue><comma_variable_lvalue_option>
<expression_or_cond_pattern> ::= <cond_pattern>
<and_expression_or_cond_pattern_option> ::= ''|' &&&
'<expression_or_cond_pattern><and_expression_or_cond_pattern_option>
<blocking_assignment> ::= <operator_assignment>
<conditional_statement> ::= 'if ('<cond_predicate>') '<statement_or_null>'
'<else_if_cond_predicate_statement_or_null_option>|'if ('<cond_predicate>') '<statement_or_null>'
'<else_if_cond_predicate_statement_or_null_option>' else '<statement_or_null>
<seq_block> ::= 'begin '<statement_or_null_option>' end'
<identifier> ::= <simple_identifier>
<integral_number> ::= <decimal_number>|<octal_number>|<binary_number>|<hex_number>
<real_number> ::=
<fixed_point_number>|<unsigned_number><exp><unsigned_number>|<unsigned_number>'.'<unsigne
d_number><exp><unsigned_number>|<unsigned_number><exp><sign><unsigned_number>|<unsigne
d_number>'.'<unsigned_number><exp><sign><unsigned_number>
<unsigned_number> ::= <decimal_digit><decimal_digit_option>
<fixed_point_number> ::= <unsigned_number>'.'<unsigned_number>
<simple_type> ::= <integer_type>|<non_integer_type>
<constant_primary> ::= <primary_literal>
<signing> ::= 'signed'|'unsigned'
<structure_pattern_key> ::= <member_identifier>|<assignment_pattern_key>
<comma_structure_pattern_key_expression_option> ::= ''|', '<structure_pattern_key>' :
'<expression><comma_structure_pattern_key_expression_option>
<array_pattern_key> ::= <constant_expression>|<assignment_pattern_key>
<comma_array_pattern_key_expression_option> ::= ''|', '<array_pattern_key>' :
'<expression><comma_array_pattern_key_expression_option>
```

```
<constant_expression> ::=
<constant_primary>|<unary_operator><constant_primary>|<constant_expression><binary_operator><
constant_expression>|<constant_expression>'?'<constant_expression>':'<constant_expression>
<integer_atom_type> ::= 'byte'|'shortint'|'int'|'longint'|'integer'|'time'
<cond_pattern> ::= <expression_without_operator_conditional_more>' matches '<pattern>
<delay_or_event_control> ::= <event_control>
<else_if_cond_predicate_statement_or_null_option> ::= '|' else if ('<cond_predicate>')
'<statement_or_null><else_if_cond_predicate_statement_or_null_option>
<statement_or_null_option> ::=
<statement_or_null>|<statement_or_null>{::}<statement_or_null_option>
<simple_identifier> ::= 'variable1'|'variable2'|'variable3'|'variable4'
<decimal_number> ::=
<unsigned_number>|<decimal_base><unsigned_number>|<size><decimal_base><unsigned_number>|
<decimal_base><x_digit>|<size><decimal_base><x_digit>|<decimal_base><z_digit>|<size><decimal_ba
se><z_digit>
<octal_number> ::= <octal_base><octal_value>|<size><octal_base><octal_value>
<binary_number> ::= <binary_base><binary_value>|<size><binary_base><binary_value>
<hex_number> ::= <hex_base><hex_value>|<size><hex_base><hex_value>
<exp> ::= 'e'|'E'
<sign> ::= '+'|'-'
<decimal_digit> ::= '0'|'1'|'2'|'3'|'4'|'5'|'6'|'7'|'8'|'9'
<integer_type> ::= <integer_vector_type>|<integer_atom_type>
<non_integer_type> ::= 'shortreal'|'real'|'realtime'
<assignment_pattern_key> ::= <simple_type>|'default'
<binary_operator> ::= '+'|'-
'|'*'|'/'|'%'|'=='|'!='|'==='|'!=='|'==?'|'!=?'|'&&'|'||'|'**'|'<'|'<='|'>'|'>='|'&'|'|'|'^'|'^~'|'~^'|'>>'|'<<'|
'>>>'|'<<<'|'->'|'<->'
<type_identifier> ::= <identifier>
<pattern> ::=
'.'<variable_identifier>|'.*'|<constant_expression>|"'{ "<pattern><comma_pattern_option>" }"|"'{ "<m
ember_identifier>" : "<pattern><comma_member_identifier_pattern_option>" }"
<event_control> ::= '@ ('<event_expression>')'|'@*'|'@ (*)'
<decimal_base> ::= "'d"|"'sd"|"'Sd"|"'D"|"'sD"|"'SD"
<size> ::= <non_zero_unsigned_number>
<x_digit> ::= 'x'|'X'
<z_digit> ::= '0'|'1'|'z'|'Z'
<octal_base> ::= "'o"|"'so"|"'So"|"'O"|"'sO"|"'SO"
<octal_value> ::= <octal_digit><octal_digit_option>
<binary_base> ::= "'b"|"'sb"|"'Sb"|"'B"|"'sB"|"'SB"
<binary_value> ::= <binary_digit><binary_digit_option>
<hex_base> ::= "'h"|"'sh"|"'Sh"|"'H"|"'sH"|"'SH"
<hex_value> ::= <hex_digit><hex_digit_option>
<integer_vector_type> ::= 'bit'|'logic'|'reg'
<packed_dimension_option> ::= "|<packed_dimension>' '<packed_dimension_option>
```

```
<variable_identifier> ::= <identifier>
<comma_pattern_option> ::= '|' '<pattern><comma_pattern_option>
<comma_member_identifier_pattern_option> ::= '|' '<member_identifier>' :
'<pattern><comma_member_identifier_pattern_option>
<event_expression> ::= <expression>|<edge_identifier>' '<expression>|<expression>' iff
'<expression>|<edge_identifier>' '<expression>' iff '<expression>|<event_expression>' or
'<event_expression>|<event_expression>', '<event_expression>|'('<event_expression>')'
<non_zero_unsigned_number> ::= <non_zero_decimal_digit><decimal_digit_option>
<octal_digit> ::= <x_digit>|<z_digit>|'0'|'1'|'2'|'3'|'4'|'5'|'6'|'7'
<binary_digit> ::= <x_digit>|<z_digit>|'0'|'1'
<hex_digit> ::=
<x_digit>|<z_digit>|'0'|'1'|'2'|'3'|'4'|'5'|'6'|'7'|'8'|'9'|'a'|'b'|'c'|'d'|'e'|'f'|'A'|'B'|'C'|'D'|'E'|'F'
<packed_dimension> ::= '['<constant_range>']'|<unsized_dimension>
<edge_identifier> ::= 'posedge'|'negedge'|'edge'
<non_zero_decimal_digit> ::= '1'|'2'|'3'|'4'|'5'|'6'|'7'|'8'|'9'
<constant_range> ::= <constant_expression>':'<constant_expression>
<unsized_dimension> ::= '[ ]'
<member_identifier> ::= <identifier>
<procedural_continuous_assignment> ::= 'assign '<variable_assignment>
<variable_assignment> ::= <variable_lvalue>' = '<expression_without_operator_conditional_more>
<decimal_digit_option> ::== ''|<decimal_digit>|<decimal_digit><decimal_digit>
<binary_digit_option> ::== ''|<binary_digit>|<binary_digit><binary_digit>
<octal_digit_option> ::== ''|<octal_digit>|<octal_digit><octal_digit>
<hex_digit_option> ::== ''|<hex_digit>|<hex_digit><hex_digit>
```

FIG. 9D

```
always @(*)
  begin
    case (NUM_BITS)
      3: begin
        r_XNOR = r_LFSR[3] ^~ r_LFSR[2];
      end
      4: begin
        r_XNOR = r_LFSR[4] ^~ r_LFSR[3];
      end
      5: begin
        r_XNOR = r_LFSR[5] ^~ r_LFSR[3];
      end
      6: begin
        r_XNOR = r_LFSR[6] ^~ r_LFSR[5];
      end
      7: begin
        r_XNOR = r_LFSR[7] ^~ r_LFSR[6];
      end
      8: begin
        r_XNOR = r_LFSR[8] ^~ r_LFSR[6] ^~ r_LFSR[5] ^~ r_LFSR[4];
      end
      9: begin
        r_XNOR = r_LFSR[9] ^~ r_LFSR[5];
      end
      10: begin
        r_XNOR = r_LFSR[10] ^~ r_LFSR[7];
      end
      11: begin
        r_XNOR = r_LFSR[11] ^~ r_LFSR[9];
      end
      12: begin
        r_XNOR = r_LFSR[12] ^~ r_LFSR[6] ^~ r_LFSR[4] ^~ r_LFSR[1];
      end
      13: begin
        r_XNOR = r_LFSR[13] ^~ r_LFSR[4] ^~ r_LFSR[3] ^~ r_LFSR[1];
      end
      14: begin
        r_XNOR = r_LFSR[14] ^~ r_LFSR[5] ^~ r_LFSR[3] ^~ r_LFSR[1];
      end
      15: begin
        r_XNOR = r_LFSR[15] ^~ r_LFSR[14];
      end
      16: begin
        r_XNOR = r_LFSR[16] ^~ r_LFSR[15] ^~ r_LFSR[13] ^~ r_LFSR[4];
      end
      17: begin
        r_XNOR = r_LFSR[17] ^~ r_LFSR[14];
      end
      18: begin
        r_XNOR = r_LFSR[18] ^~ r_LFSR[11];
```

```
        end
    19: begin
            r_XNOR = r_LFSR[19] ^~ r_LFSR[6] ^~ r_LFSR[2] ^~ r_LFSR[1];
        end
    20: begin
            r_XNOR = r_LFSR[20] ^~ r_LFSR[17];
        end
    21: begin
            r_XNOR = r_LFSR[21] ^~ r_LFSR[19];
        end
    22: begin
            r_XNOR = r_LFSR[22] ^~ r_LFSR[21];
        end
    23: begin
            r_XNOR = r_LFSR[23] ^~ r_LFSR[18];
        end
    24: begin
            r_XNOR = r_LFSR[24] ^~ r_LFSR[23] ^~ r_LFSR[22] ^~ r_LFSR[17];
        end
    25: begin
            r_XNOR = r_LFSR[25] ^~ r_LFSR[22];
        end
    26: begin
            r_XNOR = r_LFSR[26] ^~ r_LFSR[6] ^~ r_LFSR[2] ^~ r_LFSR[1];
        end
    27: begin
            r_XNOR = r_LFSR[27] ^~ r_LFSR[5] ^~ r_LFSR[2] ^~ r_LFSR[1];
        end
    28: begin
            r_XNOR = r_LFSR[28] ^~ r_LFSR[25];
        end
    29: begin
            r_XNOR = r_LFSR[29] ^~ r_LFSR[27];
        end
    30: begin
            r_XNOR = r_LFSR[30] ^~ r_LFSR[6] ^~ r_LFSR[4] ^~ r_LFSR[1];
        end
    31: begin
            r_XNOR = r_LFSR[31] ^~ r_LFSR[28];
        end
    32: begin
            r_XNOR = r_LFSR[32] ^~ r_LFSR[22] ^~ r_LFSR[2] ^~ r_LFSR[1];
        end
    endcase // case (NUM_BITS)
end // always @ (*)
```

FIG. 10B

AUTONOMOUS VERIFICATION OF CIRCUIT DESIGN FOR COMPUTING DEVICES

RELATED APPLICATIONS

This patent application is related to U.S. Ser. No. 16/836,841 entitled "AUTONOMOUS PSEUDO-RANDOM SEED GENERATOR FOR COMPUTING DEVICES" and U.S. Ser. No. 16/836,859 entitled "CREATING AND/OR ENHANCING HARDWARE OBSCURITY VIA RANDOMIZATION POINTS," all filed concurrently herewith, and all hereby expressly incorporated by reference in their entirety.

BACKGROUND

1. Field

The present disclosure relates generally to computing devices and, more particularly, to autonomous verification of circuit design for embedded computing devices, which may include, for example, IoT-type devices operating in resource constrained or like environments.

2. Information

The Internet is widespread. The World Wide Web or simply the Web, provided by the Internet, is growing rapidly, at least in part, from the large amount of content being added seemingly on a daily basis. A wide variety of content in the form of stored signals, such as, for example, text files, images, audio files, video files, web pages, measurements of physical phenomena, or the like is continually being acquired, identified, located, retrieved, collected, stored, communicated, etc. Increasingly, content is being acquired, collected, communicated, etc. by a number of embedded computing devices leveraging existing Internet or like infrastructure as part of the so-called "Internet of Things" or IoT, such as via a variety of protocols, domains, and/or applications. The IoT is typically a system of interconnected and/or internetworked physical computing devices capable of being identified, such as uniquely via an assigned Internet Protocol (IP) address, for example, and in which computing is embedded into hardware so as to facilitate and/or support devices' ability to acquire, collect, and/or transmit content over one or more communications networks. IoT devices may comprise a wide variety of embedded devices, such as, for example, automobile sensors, biochip transponders, heart monitoring implants, thermostats, kitchen appliances, locks or like fastening devices, solar panel arrays, home gateways, controllers, or the like.

In some instances, the nature of IoT-type devices, such as by virtue of having an embedded computing and/or communication capability, which may include a capability to automatically access the Internet, for example, may make the IoT-type devices vulnerable. For example, at times, IoT-type devices may be prone to hacking, nefarious log-in exploits, or like security risks that may give on-line attackers access to and/or control of the devices and, as a consequence, compromise associated services, systems, networks, infrastructures, or the like. However, in some instances, more traditional security measures, such as anti-virus, malware, or like defenses, for example, may not be suitable for and/or applicable to IoT-type devices. For example, in contrast to more advanced computing platforms with more sophisticated anti-virus, malware, or like defenses, many IoT-type devices may comprise peripheral or end-point and/or resource-constrained embedded devices that utilize lower-cost hardware and/or software solutions lacking computing and/or processing power to run a sufficient security software. Thus, how to secure IoT-type devices, including those operating in resource constrained or like environments, for example, continues to be an area of development.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIGS. 9A-9D illustrate an implementation of an example Verilog grammar.

FIGS. 10A-10B illustrate an implementation of example syntactically correct LFSR-tailored Verilog code.

Figure 1:
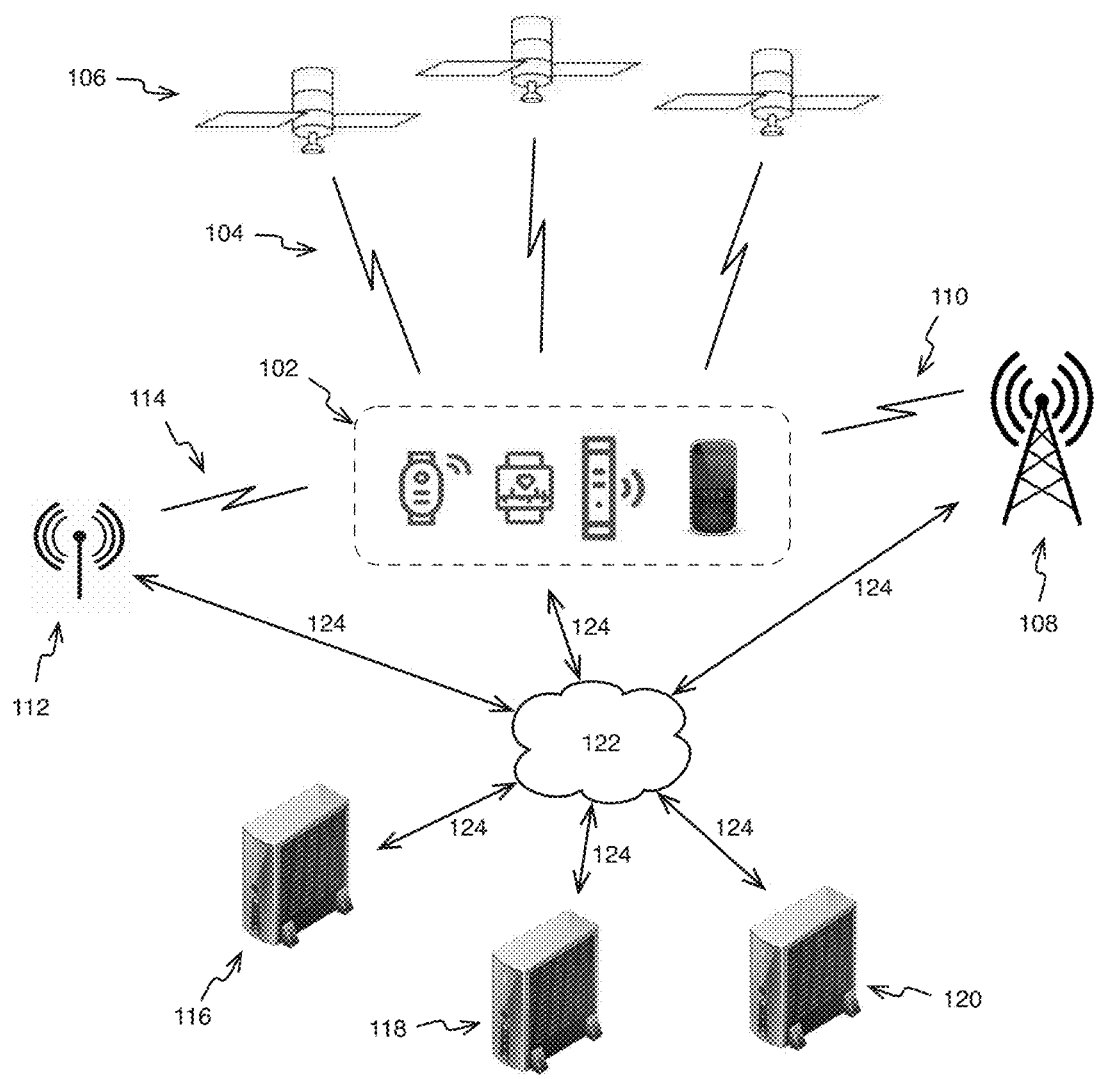
FIG. 1 is a schematic diagram illustrating features associated with an implementation of an example operating environment for IoT-type devices.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others, one or more aspects, properties, etc. may be omitted, such as for ease of discussion, or the like. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers at least to the context of the present patent application.

Some example methods, apparatuses, and/or articles of manufacture are disclosed herein that may be used, in whole or in part, to facilitate and/or support one or more operations and/or techniques for autonomous verification of circuit design for IoT-type devices, such as implemented in connection with one or more computing and/or communication networks and/or protocols (e.g., network protocols) discussed herein, for example. As discussed below, in some instances, these or like one or more operations and/or techniques may be implemented, in whole or in part, to facilitate and/or support one or more approaches for a more secure and/or reliable operation of IoT-type devices including, for example, IoT-type devices operating in resource constrained or like environments. As will be seen, at times, these one or more approaches may include, for example, grammatically evolving particular domain knowledge and incorporating such knowledge into a system-on-a-chip (SOC) design flow so as to generate a suitable or sufficient number of hardware solutions with an appropriate or otherwise suitable distribution of randomness. As also discussed below, these one or more approaches may also include, for example, autonomous verification of these or like hardware solutions, such as part of a SOC design flow so as to further mitigate security concerns.

As will also be seen, in some instances, these or like hardware solutions may comprise, for example, linear feedback shift registers (LFSRs) that may be incorporated into an appropriate number of IoT-type devices and capable of creating sufficient or otherwise suitable distribution randomness in these devices, such as via generating start state initialization numbers and/or continually evolving a unique open-ended fixed instruction sequence. For purposes of explanation, typically, an LFSR may comprise a digital logic circuit, such as a sequential bi-stable logic circuit, just to illustrate one particular example, capable of storing and/or transferring (e.g., shifting, etc.) applicable digital signal values and whose at least one input value comprises a linear function of its previous state. As also discussed below, at times, particular domain knowledge may, for example, be represented via a subset of a grammar comprising an applicable computer programming language, such as via computer-readable code or instructions that perform a specific task. As will also be seen, in at least one implementation, a particular computer programming language, such as a hardware description language (HDL), such as Verilog, for example, may be utilized herein, in whole or in part, or otherwise considered. As such, here, a "computer programming language" should be interpreted broadly, such as represented via computer-readable code or instructions capable of being executed via a number of sequential and/or parallel operations. Thus, here, one or more lines of code may be executed one at a time, such as following a top-to-bottom organization, for example, and/or in parallel, such as to facilitate and/or support a simultaneous operation of separate portions of digital hardware, if appropriate or applicable, despite corresponding lines of code being written using a top-to-bottom organization. Particular examples of IoT-type devices, LFSRs, applicable computer programming language, etc. will be discussed in greater detail below.

Also discussed below are example approaches to verifying autonomously generated HDL code, such as Verilog code. For example, in an implementation, a grammatical evolution process may generate evolved HDL code, such as Verilog code tailored to a particular functionality, and such evolved HDL code may be verified via a process utilizing BNF input grammar to perform at least part of the verification. Thus, in an implementation, a subset of Verilog generated as part of a grammatical evolution process may, for example, be proven against a Verilog BNF definition. Thus, BNF grammar may describe a particular search-space language and may further provide at least partial verification of an evolved Verilog solution. Additionally, as seen below, further tailoring inputted BNF, such as beyond rules obtained from a full Verilog BNF grammar, for example, may help ensure that a particular outputted solution has particular advantageous characteristics that may depend, at least in part, on a particular application. In some instances, utilizing such an example approach, an increase in efficiency and/or efficacy with respect to verification of evolved Verilog code may be achieved.

As further discussed below, at times, a BNF grammar may serve as an example template for a target application, for example, and/or may be utilized, at least in part, to verify applicable HDL code. For example, utilizing a grammar template, an example instance of a particular application may be tested against the grammar template to determine whether a particular evolved HDL solution is compatible and/or compliant with the specifications of an appropriate grammar. Further, a grammar template may be utilized, in whole or in part, to create different versions of a particular application, which may mitigate security concerns such as in situations wherein multiple instances of a particular application have or share the same or similar HDL code, for example.

"Electronic content," as the term used herein, should be interpreted broadly and refers to signals, such signal packets, for example, and/or states, such as physical states on a memory device, for example, but otherwise is employed in a manner irrespective of format, such as any expression, representation, realization, and/or communication, for example. Content may comprise, for example, any information, knowledge, and/or experience, such as, again, in the form of signals and/or states, physical or otherwise. In this context, "electronic" or "on-line" content refers to content in a form that although not necessarily capable of being perceived by a human, (e.g., via human senses, etc.) may nonetheless be transformed into a form capable of being so perceived, such as visually, haptically, and/or audibly, for example. Non-limiting examples may include text, audio, images, video, security parameters, combinations, or the like. Thus, content may be stored and/or transmitted electronically, such as before or after being perceived by human senses. In general, it may be understood that electronic content may be intended to be referenced in a particular discussion, although in the particular context, the term "content" may be employed for ease of discussion. Specific examples of content may include, for example, computer code, metadata, message, text, audio file, video file, data file, web page, or the like. Claimed subject matter is not intended to be limited to these particular examples, of course.

As alluded to previously, at times, securing and/or maintaining IoT-type devices may, for example, present a number of challenges, which may be due, at least in part, to the devices' inherent ability to automatically access and/or communicate on a network, such as the Internet, as one possible example. Typically, although not necessarily, in contrast to more advanced computing platforms with more sophisticated anti-virus, malware, or like security mechanisms or defenses, many IoT-type devices may comprise, for example, resource constrained edge or peripheral embedded devices that utilize hardware and/or software solutions lacking computing and/or processing power to run a security software, implement secure updates and/or communication, or the like. As such, in some instances, IoT-type devices may be vulnerable to, for example, brute-force attacks and/or other nefarious on-line attacks, log-in exploits, etc. that may give on-line attackers access to and/or control of these devices and, as a consequence, compromise associated services, systems, networks, infrastructures, or the like.

In some instances, to address these or like challenges, one or more security approaches may be utilized. For example, since IoT-type devices utilize Internet or like network communications exchange protocols (e.g., SSL/TLS, SSH, IKE, etc.), at times, more secure operation of such devices may depend, at least in part, on cryptographic or like security features, such as in the form of pseudo-random number generators (PRNGs). As a way of illustration, in some instances, PRNGs may, for example, be capable of mitigating a threat of unauthorized device intrusions, such as via introducing randomness into one or more associated security parameters. By way of explanation, typically, a PRNG comprises a computing device and/or process capable of generating a sequence of numbers whose properties approximate one or more properties of sequences of random numbers. A PRNG is typically initialized via a special random input value, called a "seed," which is generated by some source of randomness that may comprise an IoT-type device. Such a seed may determine and/or facilitate an output of a random sequence by a PRNG, which may be used, in whole or in part, to protect confidentiality and/or integrity of an IoT-type device and/or electronic content, implement more secure network communications, updates and/or other operations, or the like. As such, at times, a security of a PRNG and, thus, of an associated IoT-type device may, for example, depend, in whole or in part, on randomness of a seed. Thus, in some instances, it may be useful for more secure operation of IoT-type devices to employ an appropriate or otherwise suitable source of randomness.

In some instances, however, finding and/or employing an appropriate or otherwise suitable source of randomness, such as for outputting a random seed value, for example, may present challenges. To illustrate, since real-time clocks (RTCs) are typically, although not necessarily, run with a fixed frequency, certain IoT-type devices, such as those employing an RTC as a source of randomness to produce a seed, for example, may be prone or otherwise susceptible to generating readable and/or predictable pseudo-random patterns and, as such, may deliver a discoverable output. Also, in some instances, RTCs may not be available for certain IoT-type devices, for example, and, if present, may be operationally expensive, less than sufficient or suitable to properly initialize a PRNG due, at least in part, to hardware and/or environmental limitations inherent to IoT-type devices, or the like. In addition, at times, it may be useful to verify code samples comprising these or like PRNGs, such as in an autonomous manner, for example, so as to facilitate and/or support appropriate and/or suitable patterns of behavior inherent to these or like PRNG while eliminate solutions that may be prone to incorrect and/or undesirable behavior.

Accordingly, it may be desirable to develop one or more methods, systems, and/or apparatuses that may implement a PRNGs capable of producing a seed value, such as without reliance on an RTC, for example, that may introduce a sufficient or otherwise suitable amount and/or distribution of randomness into IoT-type devices so as to preclude or reduce readable and/or predictable patterns while saving power through execution on-demand and/or verify generated code samples in a more effective and/or more efficient manner.

Thus, as will be described in greater detail below, in an implementation, an extended Backus-Naur form (EBNF) representation of a particular HDL grammar, such as a Verilog grammar, for example, may be electronically obtained and/or subsequently pruned, such as for an LFSR functionality. To facilitate and/or support more effective and/or more efficient processing, at times, a pruned EBNF grammar may be converted to a Backus-Naur form (BNF), for example, and used, at least in part, as input to a suitable grammatical evolution tool, such as PonyGE2, just to illustrate one particular example. As will also be seen, in some instances, one or more evolutionary criteria may be defined and used, at least in part, in connection with one or more PonyGE2 runs, such as to incorporate and/or grammatically evolve appropriate knowledge via a genotype encouraging a suitable and/or sufficient variety of patterns of behavior inherent to LFSRs, for example. These or like LFSRs may be part of SoC design flows, for example, so as to comprise PRNGs substantially corresponding to a number of IoT-type devices. Further, as will be described in greater detail below, in an implementation, BNF representations of grammatically evolved code, such as HDL code, may be verified at least in part via comparison with specified BNF grammars, for example.

PRNGs may, for example, be capable of facilitating a predetermined variation of starting states across these IoT-type devices, such as via generating and/or providing seeds for start-state initialization numbers capable of introducing appropriate or otherwise suitable distribution of randomness, as will also be seen. In operative use, an instruction sequence may take input from a PRNG portion of an LFSR, for example, and may run through a random sequence to produce a seed, which may then be placed into a pseudo-random generator initialization function of an IoT-type device. In some instances, an instruction sequence may also be continually evolved, such as via one or more linear genetic programming approaches, for example, so as to generate a new or different seed value once a random input is called (e.g., every time, etc.). In addition, removal of an RTC may, for example, save computing and/or processing power, which may be beneficial at an IoT scale, as was also indicated. Again, particular examples of an EBNF, BNF, LFSR, PonyGE2 runs, benefits, etc., including verification of grammatically evolved HDL code, will be discussed in greater detail below.

FIG. 1 is a schematic diagram illustrating features associated with an implementation of an example operating environment 100 capable of facilitating and/or supporting one or more operations and/or techniques for autonomous verification of circuit design for IoT-type devices, such as grammatically evolved HDL code, for example, illustrated generally herein at 102. In this context, "IoT-type devices" refer to one or more electronic or computing devices capable of leveraging existing Internet or like infrastructure as part of the so-called "Internet of Things" or IoT, such as via a variety of applicable protocols, domains, applications, etc. As was indicated, the IoT is typically a system of interconnected and/or internetworked physical devices in which computing is embedded into hardware so as to facilitate and/or support devices' ability to acquire, collect, and/or communicate content over one or more communications networks, for example, at times, without human participation and/or interaction. IoT-type devices may include a wide variety of stationary and/or mobile devices, such as, for example, automobile sensors, biochip transponders, heart monitoring implants, kitchen appliances, locks or like fastening devices, solar panel arrays, home gateways, smart gauges, smart telephones, cellular telephones, security cameras, wearable devices, thermostats, Global Positioning System (GPS) transceivers, personal digital assistants (PDAs), virtual assistants, laptop computers, personal entertainment systems, tablet personal computers (PCs), PCs, personal audio or video devices, personal navigation devices, or the like. Typically, in this context, a "mobile device" refers to an electronic or computing device that may from time to time have a position or location that changes, and a stationary device refers to a device that may have a position or location that generally does not change. In some instances, IoT-type devices may be capable of being identified, such as uniquely, via an assigned Internet Protocol (IP) address, as one particular example, and/or having the ability to communicate, such as receive and/or transmit electronic content, for example, over one or more wired and/or wireless communications networks.

It should be appreciated that operating environment 100 is described herein as a non-limiting example that may be implemented, in whole or in part, in the context of various wired or wireless communications networks, or any suitable portion and/or combination of such networks. For example, these or like networks may include one or more public networks (e.g., the Internet, the World Wide Web), private networks (e.g., intranets), wireless wide area networks (WWAN), wireless local area networks (WLAN, etc.), wireless personal area networks (WPAN), telephone networks, cable television networks, Internet access networks, fiber-optic communication networks, waveguide communication networks, or the like. It should also be noted that claimed subject matter is not limited to a particular network and/or operating environment. Thus, depending on an implementation, one or more operations and/or techniques for a PRNG for IoT-type devices, may be performed, at least in part, in an indoor environment, an outdoor environment, or any combination thereof.

Thus, as illustrated, in an implementation, one or more IoT-type devices 102 may, for example, receive or acquire satellite positioning system (SPS) signals 104 from SPS satellites 106. In some instances, SPS satellites 106 may be from a single global navigation satellite system (GNSS), such as the GPS or Galileo satellite systems, for example. In other instances, SPS satellites 106 may be from multiple GNSS such as, but not limited to, GPS, Galileo, Glonass, or Beidou (Compass) satellite systems. In certain implementations, SPS satellites 106 may be from any one several regional navigation satellite systems (RNSS) such as, for example, WAAS, EGNOS, QZSS, just to name a few examples.

At times, one or more IoT-type devices 102 may, for example, transmit wireless signals to, or receive wireless signals from, a suitable wireless communication network. In one example, one or more IoT-type devices 102 may communicate with a cellular communication network, such as by transmitting wireless signals to, or receiving wireless signals from, one or more wireless transmitters capable of transmitting and/or receiving wireless signals, such as a base station transceiver 108 over a wireless communication link 110, for example. Similarly, one or more IoT-type devices 102 may transmit wireless signals to, or receive wireless signals from a local transceiver 112 over a wireless communication link 114. Base station transceiver 108, local transceiver 112, etc. may be of the same or similar type, for example, or may represent different types of devices, such as access points, radio beacons, cellular base stations, femtocells, an access transceiver device, or the like, depending on an implementation. Similarly, local transceiver 112 may comprise, for example, a wireless transmitter and/or receiver capable of transmitting and/or receiving wireless signals. For example, at times, wireless transceiver 112 may be capable of transmitting and/or receiving wireless signals from one or more other terrestrial transmitters and/or receivers.

In a particular implementation, local transceiver 112 may, for example, be capable of communicating with one or more IoT-type devices 102 at a shorter range over wireless communication link 114 than at a range established via base station transceiver 108 over wireless communication link 110. For example, local transceiver 112 may be positioned in an indoor or like environment and may provide access to a wireless local area network (WLAN, e.g., IEEE Std. 802.11 network, etc.) or wireless personal area network (WPAN, e.g., Bluetooth® network, etc.). In another example implementation, local transceiver 112 may comprise a femtocell or picocell capable of facilitating communication via link 114 according to an applicable cellular or like wireless communication protocol. Again, it should be understood that these are merely examples of networks that may communicate with one or more IoT-type devices 102 over a wireless link, and claimed subject matter is not limited in this respect. For example, in some instances, operating environment 100 may include a larger number of base station transceivers 108, local transceivers 112, networks, terrestrial transmitters and/or receivers, etc.

In an implementation, one or more IoT-type devices 102, base station transceiver 108, local transceiver 112, etc. may, for example, communicate with one or more servers, referenced herein at 116, 118, and 120, over a network 122, such as via one or more communication links 124. Network 122 may comprise, for example, any combination of wired or wireless communication links. In a particular implementation, network 122 may comprise, for example, Internet Protocol (IP)-type infrastructure capable of facilitating or supporting communication between one or more IoT-type devices 102 and one or more servers 116, 118, 120, etc. via local transceiver 112, base station transceiver 108, directly, etc. In another implementation, network 122 may comprise, for example, cellular communication network infrastructure, such as a base station controller or master switching center to facilitate and/or support mobile cellular communication with one or more IoT-type devices 102. Servers 116, 118, and/or 120 may comprise any suitable servers or combination thereof capable of facilitating or supporting one or more operations and/or techniques discussed herein. For example, servers 116, 118, and/or 120 may comprise one or more content servers, simulation servers, update servers, back-end servers, management servers, archive servers, location servers, positioning assistance servers, navigation servers, map servers, crowdsourcing servers, network-related servers, or the like.

In particular implementations, one or more IoT-type devices 102 may have circuitry or processing resources capable of determining a position fix or estimated location of one or more IoT-type devices 102, initial (e.g., a priori) or otherwise. For example, if satellite signals 104 are available, one or more IoT-type devices 102 may compute a position fix based, at least in part, on pseudorange measurements to four or more SPS satellites 106. Here, one or more IoT-type devices 102 may, for example, compute such pseudorange measurements based, at least in part, on pseudonoise code phase detections in signals 104 acquired from four or more SPS satellites 106. In particular implementations, one or more IoT-type devices 102 may receive from one or more servers 116, 118, or 120 positioning assistance data to aid in the acquisition of signals 104 transmitted by SPS satellites 106 including, for example, almanac, ephemeris data, Doppler search windows, just to name a few examples.

In some implementations, one or more IoT-type devices 102 may obtain a position fix by processing wireless signals received from one or more terrestrial transmitters positioned at known locations (e.g., base station transceiver 108, local transceiver 112, etc.) using any one of several techniques, such as, for example, Observed Time Difference Of Arrival (OTDOA), Advanced Forward Link Trilateration (AFLT), or the like. In these techniques, a range from one or more IoT-type devices 102 may, for example, be measured to three or more of terrestrial transmitters based, at least in part, on one or more positioning reference signals transmitted by these transmitters and received at one or more IoT-type devices 102, as was indicated. Here, servers 116, 118, or 120 may be capable of providing positioning assistance data to one or more IoT-type devices 102 including, for example, OTDOA reference transmitter data, OTDOA neighbor transmitter data, reference signal time difference search window, quality of service parameters, positioning reference signal configuration parameters, locations, identities, orientations, etc. of one or more terrestrial transmitters to facilitate and/or support one or more applicable positioning techniques (e.g., AFLT, OTDOA, etc.). At times, servers 116, 118, or 120 may include, for example, a base station almanac (BSA) indicating locations, identities, orientations, etc. of cellular base stations (e.g., base station transceiver 108, local transceiver 112, etc.) in one or more particular areas or regions associated with operating environment 100.

As alluded to previously, in particular environments, such as indoor or like environments (e.g., urban canyons, etc.), for example, one or more IoT-type devices 102 may not be capable of acquiring and/or processing signals 104 from a sufficient number of SPS satellites 106 so as to perform a suitable positioning technique. Thus, optionally or alternatively, one or more IoT-type devices 102 may, for example, be capable of determining a position fix based, at least in part, on signals acquired from one or more local transmitters, such as femtocells, Wi-Fi access points, or the like. For example, one or more IoT-type devices 102 may obtain a position fix by measuring ranges to three or more local transceivers 112 positioned at known locations. In some implementations, one or more IoT-type devices 102 may, for example, measure ranges by obtaining a media access control (MAC) address from local transceiver 112 using one or more appropriate techniques.

In an implementation, one or more IoT-type devices 102 may, for example, receive positioning assistance data (e.g., OTDOA, AFLT assistance data, etc.) for one or more positioning operations from servers 116, 118, and/or 120. At times, positioning assistance data may include, for example, locations, identities, orientations, positioning reference signal configurations, etc. of one or more local transceivers 112, base station transceivers 108, etc. positioned at known locations for measuring ranges to these transmitters based, at least in part, on an round-trip time (RTT), time of arrival (TOA), time difference of arrival (TDOA), etc., or any combination thereof. In some instances, positioning assistance data to aid indoor positioning operations may include, for example, radio heat maps, context parameter maps, routeability graphs, etc., just to name a few examples. Other assistance data received by one or more IoT-type devices 102 may include, for example, electronic digital maps of indoor or like areas for display or to aid in navigation. For example, if an IoT-type device comprises a mobile device, a map may be provided to the mobile device as it enters a particular area, for example, and may show applicable features such as doors, hallways, entry ways, walls, etc., points of interest, such as bathrooms, pay phones, room names, stores, or the like. By obtaining a digital map of an indoor or like area of interest, a mobile IoT device may, for example, be capable of overlaying its current location over the displayed map of the area so as to provide an associated user with additional context, frame of reference, or the like.

According to an implementation, one or more IoT-type devices 102 may access navigation assistance data via servers 116, 118, and/or 120 by, for example, requesting such data through selection of a universal resource locator (URL). In particular implementations, servers 116, 118, and/or 120 may be capable of providing navigation assistance data to cover many different areas including, for example, floors of buildings, wings of hospitals, terminals at an airport, portions of a university campus, areas of a large shopping mall, etc., just to name a few examples. Also, if memory, data transmission and/or processing resources at one or more IoT-type devices 102 make receipt of positioning assistance data for all areas served by servers 116, 118, and/or 120 impractical or infeasible, a request for such data from one or more IoT-type devices 102 may, for example, indicate a rough or course estimate of a location of one or more IoT-type devices 102. One or more IoT-type devices 102 may then be provided navigation assistance data covering, for example, one or more areas including or proximate to a roughly estimated location of one or more IoT-type devices 102.

Even though a certain number of computing platforms and/or devices are illustrated herein, any number of suitable computing platforms and/or devices may be implemented to facilitate and/or support one or more techniques and/or processes associated with operating environment 100. For example, at times, network 122 may be coupled to one or more wired and/or wireless communication networks (e.g., WLAN, etc.) so as to enhance a coverage area for communications with one or more IoT-type devices 102, one or more base station transceivers 108, local transceiver 112, servers 116, 118, 120, or the like. In some instances, network 122 may facilitate and/or support femtocell-based operative regions of coverage, for example. Again, these are merely example implementations, and claimed subject matter is not limited in this regard.

Figure 2:
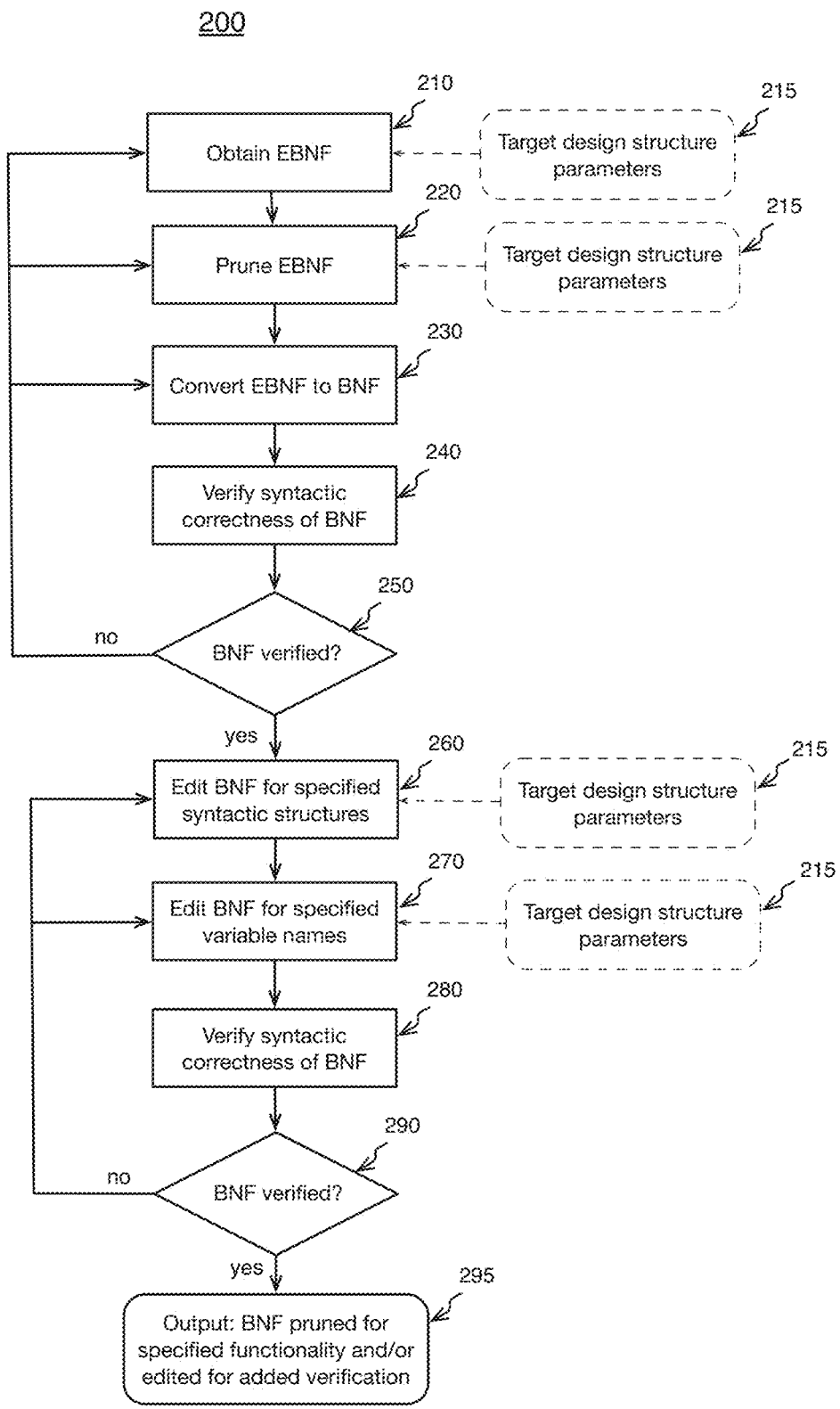
FIG. 2 is a flow diagram illustrating an implementation of an example process for verification of circuit design for IoT-type devices.

Attention is now drawn to FIG. 2, which is a flow diagram illustrating an implementation of an example process 200 that may be performed, in whole or in part, to facilitate and/or support one or more operations and/or techniques for autonomous verification of grammatically evolved code, such as HDL code, for IoT-type devices. As was indicated and as will be seen, at times, process 200 may be implemented, at least in part, in connection with a grammatical evolution tool that may be used, in whole or in part, to grammatically evolve particular domain knowledge so as to encourage a suitable and/or sufficient variety of patterns of behavior inherent to LFSRs, for example. As will also be seen, in some instances, particular domain knowledge may, for example, be represented via one or more content structures comprising arrays of linear genotypic binary or integer variables, called genomes, and in which a particular arrangement may represent a candidate solution. It should be noted that content acquired or produced, such as, for example, input signals, output signals, operations, results, etc. associated with example process 200 may be represented via one or more digital signals. It should also be appreciated that even though one or more operations are illustrated or described concurrently or with respect to a certain sequence, other sequences or concurrent operations may be employed. In addition, although the description below references particular aspects and/or features illustrated in certain other figures, one or more operations may be performed with other aspects and/or features.

Thus, example process 200 may, for example, begin at operation 210 with obtaining an EBNF representation of a particular HDL grammar, such as a Verilog grammar, just to illustrate one possible implementation. Generally, a grammar may comprise a set of rules that describe syntax of sentences and/or expressions in a language. In certain simulations or experiments, it has been observed that, to facilitate and/or support grammatical evolution, it may, for example, be useful to employ a context-fee grammar, such as a grammar in which rules are not sensitive to the sentence's context. In addition, it has also been observed that a grammar of a particular computer programming language, such as a Verilog HDL grammar, for example, may be useful due, at least in part, to its syntax's suitability and/or applicability to represent a desired functionality, such as LFSR functionality and/or its expected behavior (e.g., modeling, SOC design, etc.). For example, a Verilog HDL or simply Verilog comprises a specialized computer programming language expressed in a textual format that may be used, at least in part, for describing or specifying a structure and/or behavior of electronic circuits, such as digital logic circuits, as one example. As such, in some instances, Verilog may, for example, be used, in whole or in part, for modeling electronic systems, for verification through simulation, timing analysis, test analysis (e.g., testability analysis, fault grading, etc.), logic synthesis, or the like. In an implementation, obtaining an EBNF grammar may be informed, at least in part, by one or more target design parameters 215, for example. A particular example of obtaining an EBNF grammar that may be implemented, at least in part, in connection with operation 210, for example, will be discussed in greater detail below, such as with reference to FIG. 3.

Having obtained an EBNF grammar, example process 200 may, for example, proceed to operation 220, such as to prune an obtained EBNF grammar for a suitable functionality. For example, as was indicated, in some instances, such as instead of using a full set of an EBNF grammar, it may be useful to create a particular subset of an EBNF grammar that may tailored to implement a desired functionality, such as an LFSR functionality, just to illustrate one possible implementation. In some instances, an LFSR functionality may be useful to create sufficient or otherwise suitable distribution of randomness across a given and/or limited number of hardware solution variants, among other things, such as via shifting one or more appropriate digital signal values according to an applicable linear function, for example. Thus, at times, an EBNF grammar may, for example, be pruned, such as via extracting and/or removing syntactic items not suitable or useful for a desired functionality, for example, such as to facilitate and/or support phenotype consistency. Typically, in the context of grammatical evolution, a "genotype" refers to a bit string (e.g., an array of binary variables, etc.), and a "phenotype" refers to its expression (e.g., a computer program, code, string, etc.). Likewise, a particular example of pruning an EBNF grammar for a LFSR functionality will be discussed in greater detail below, such as with reference to FIG. 4, for example.

According to an implementation, example process 200 may proceed to operation 230 and may convert an EBNF grammar, such as pruned for an LFSR functionality, for example, to a BNF grammar. For example, in certain simulations or experiments, it has been observed that, in some instances, utilizing a grammar expressed via an extended version of Backus-Naur form may be less beneficial or suitable, such as for facilitating and/or supporting one or more operations or processes for grammatical evolution, among other operations. For example, it has been observed that, at times, recursive EBNF rules or functions may be less useful for specifying applicable structures, and that rule names may be more concisely or suitably defined via a BNF grammar, such as with less options or without an undue number of options within a particular rule. However, since a grammar of a current Verilog HDL is explained or specified via an EBNF, in some instances, it may be useful to convert an EBNF grammar to a simpler or otherwise more suitable BNF grammar, as was indicated. In addition, since an EBNF notation is more widely—and even universally—recognized and/or accepted, at times, it may be difficult and/or impossible to access and/or obtain a standard or applicable BNF grammar, such as a BNF grammar that may be functionally equivalent or similar to an EBNF grammar tailored for a desired functionality. A particular example of converting an EBNF grammar to a BNF grammar will be discussed in greater detail below, such as with reference to FIG. 5, for example.

Thus, in a particular implementation, as a result of operation 230, a subset of a Verilog BNF grammar that focuses on an LFSR area, for example, may be generated and/or obtained, such as to further limit or restrict a search space during one or more grammatical evolution operations. For example, a subset of a tailored Verilog BNF grammar may be stored as one or more digital signals and/or states in a suitable computer file and may be used, in whole or in part, as input to a suitable grammatical evolution tool, such as in connection with one or more evolutionary parameters so as to facilitate and/or support a suitable and/or sufficient variation in LFSRs, for example. By way of example but not limitation, a particular implementation of a subset of a Verilog grammar 900 that focuses on a LFSR area of the grammar is illustrated in FIGS. 9A-9D.

Continuing with example process 200, as referenced at operation 240, at least in part responsive to obtaining a BNF grammar, such as a subset of a Verilog BNF grammar that focuses on an LFSR area, for example, the BNF grammar may be verified for syntactical correctness and/or may be verified to ensure that the BNF grammar is an accurate representation of a target language. For example, responsive at least in part to converting an EBNF grammar to a BNF grammar, there may be issues with a grammar that may leave it insufficient and/or otherwise unsuitable for use in generating and/or verifying HDL code, such as Verilog code.

Further, for example, it may be possible to make mistakes while editing a BNF grammar for functionality and/or for better formed rules. As may be seen herein, verification of syntactic correctness of a BNF grammar may be employed at least in part in response to initial alterations to source EBNF grammar and/or prior to a BNF grammar being utilized for subsequent applications.

In particular implementations, various approaches may be utilized to verify correctness and/or suitability of a BNF grammar. If a particular BNF grammar is not properly formed, for example, uses of the grammar may yield unsatisfactory outcomes. In an implementation, for example, a subset of a tailored and/or otherwise specified Verilog BNF grammar may be fed, such as used as an input, for example, into a suitable grammatical evolution tool to verify syntactic correctness of a BNF grammar, for example. In at least one implementation, a PonyGE2 tool may, for example, be utilized, in whole or in part, or otherwise considered. For purposes of explanation, a PonyGE2 tool or simply PonyGE2 is an open source implementation of grammatical evolution in Python, developed by the Natural Computing Research and Applications Group at the University College Dublin (accessible at: https://github.com/ugultopu/PonyGE2). Since PonyGE2 is built in Python, it may facilitate and/or support grammatical evolution of Python syntax, which may include Verilog syntax. More specifically, it may make outputted computer code or instructions more readable, such as, for example, by parsing code breaks and/or making ranges in a grammar to be more concisely expressed. Depending on an implementation, PonyGE2 may grammatically evolve a BNF grammar defined via a specification of an entire language, for example, or via a subset of a grammar tailored to implement a particular functionality, such as an LFSR functionality, as was indicated.

To verify syntactical correctness of a BNF grammar, for example, PonyGE2 and/or other suitable tool may follow grammatical paths, such as from a particular rule to rules within the particular rule, for example, until particular paths reach terminal values, in an implementation. PonyGE2 may detect circular rules, for example, that may be problematic at least in part because any code generated from such grammar may result in an infinite cycle of rules, for example. In an implementation, syntactic correctness of a BNF grammar may be accomplished at least in part via generation of code utilizing rules included by the grammar and/or by checking to ensure that the generated code can be compiled and/or executed successfully (e.g., without error and/or within expected limits). A particular code sample may not perform any particular function, for example, but if it compiles and/or executes as expected then the grammar may be determined to successfully describe a context-free version of the grammar. Further, in an implementation, verification may be accomplished at least in part by comparing an output, such as a code sample, with one or more particular specified and/or desired goal characteristics. For example, if an output, such as a code sample, is within an acceptable goal range, the function may be said to have been successfully implemented. Otherwise, if the output is not within an acceptable goal range, the particular code sample may be determined to have failed verification.

In some instances, a particular computer file, such as a parameter and/or configuration file may, for example, be generated and may also be used, in whole or in part, as input to PonyGE2, such as in connection with subset of a tailored BNF grammar. Depending on an implementation, a file may comprise an input specification comprising one or more evolutionary criteria and/or applicable parameters, such as for use in connection with one or more PonyGE2 runs, for example. It should be noted that even though a file may be described herein as an external file, in some instances, a file internal to PonyGE2, or any combination of an external and internal files, may be used herein, in whole or in part. It should also be noted that, even though a single file may be described herein, such as for ease of discussion, any suitable number of files may be generated and/or used herein (e.g., a parameter file, fitness function file, etc.), in whole or in part. As illustrated, in an implementation, evolutionary criteria may include, for example, a number of input parameters, such as a number of generations, size of population, type and percent chance of crossover, type and percent chance of mutation, etc.

As referenced generally at operation 250, a determination may be made as to whether a BNF grammar has been satisfactorily verified. As mentioned, in an implementation a BNF grammar may be determined to have been successfully verified if an output, such as a code sample based on the BNF grammar, is successfully compiled (e.g., goes through Verilog compiler without error and/or within an expected range). As further mentioned, verification of a BNF may be accomplished at least in part by comparing an output, such as a code sample, with one or more particular specified and/or desired goal characteristics. For example, if an output, such as a code sample, is within an acceptable goal range, the function may be said to have been successfully implemented. Otherwise, if the output is not within an acceptable goal range, the particular code sample may be determined to have failed verification. In a particular implementation, at least in part in response to a determination that a BNF grammar has not been satisfactorily verified, such as according to a fitness score failing to at least meet a specified threshold, for example, process 200 may return to example operations 210, 220, and/or 230 for further acquisition, pruning, and/or converting of source EBNF grammar, for example. Further, as seen, at times, a fitness function may also be defined and/or used, at least in part, to evaluate a number of HDL code samples, such as a number of individual LFSR solutions, for example, via computing and/or assigning corresponding fitness values, such as to determine and/or eliminate solutions that may be prone to incorrect and/or undesirable behavior, for example, while selecting subsequent generations. As also illustrated, in some instances, a grammar style of mutation, such as mutation occurring on one or more terminals comprising end leaf options and rules within a grammar, for example, may be used, at least in part, or otherwise considered, just to illustrate one possible implementation.

As also depicted at operation 250, at least in part in response to a determination that a BNF grammar has been satisfactorily verified, for example, process 200 may proceed to operation 260, wherein, for example, a BNF grammar may be edited for specific syntactic structures. A BNF grammar may further be edited for specified variable names at operation 270, in an implementation. Example operations to edit a BNF grammar for specific syntactic structures and/or to edit a BNF grammar for specific variable names is described more fully below in connection with FIG. 7, for an implementation.

Continuing with example process 200, as referenced at operation 280, at least in part responsive to editing a BNF grammar for specified syntactic structures and/or for specified variable names, the BNF grammar may again be verified for syntactical correctness and/or the BNF grammar may again be verified to ensure that the BNF grammar is an accurate representation of a target language. See the discussion above in connection with operation 240 for additional details, for an implementation.

As indicated at operation 290, for example, a determination may be made as to whether a BNF grammar has been satisfactorily verified. As mentioned, at times, a fitness function may be defined and/or used, at least in part, to evaluate a number of HDL code samples, such as a number of individual LFSR solutions, for example, via computing and/or assigning corresponding fitness values, such as to determine and/or eliminate solutions that may be prone to incorrect and/or undesirable behavior, for example. At least in part in response to a determination that a BNF grammar has not been satisfactorily verified, such as according to a fitness score failing to at least meet a specified threshold, for example, process 200 may return to example operations 260 and/or 270 for further operations to edit a BNF grammar for specific syntactic structures and/or to edit a BNF grammar for specific variable names, in a particular implementation.

As also depicted at operation 290, at least in part in response to a determination that a BNF grammar has been satisfactorily verified, such as according to a fitness score at least meeting a specified threshold, for example, process 200 may proceed to operation 295. As referenced at 295, according to an implementation, based, at least in part, on the above-referenced input, a BNF representation of a syntactically correct Verilog code or instructions, such as tailored to implement an LFSR functionality, for example, may be generated and/or obtained, such as in the form of an appropriate output. By way of example but not limitation, a syntactically correct LFSR-tailored Verilog code or instructions 1000 that were used, at least in part, in connection with a particular simulation or experiment is illustrated in FIGS. 10A-10B.

According to an implementation, example process 200 may implement one or more grammatical evolution operations and/or processes via PonyGE2. For example, in some instances, syntactically correct Verilog code may be used, at least in part, as input to PonyGE2, such as in connection with evolutionary criteria, such as referenced 215, so as to grammatically evolve a suitable or otherwise sufficient number LFSR solutions, for example. Further, for example, optimal or sufficient solutions, such as definable via an evolved, tailored and/or verified Verilog grammar, for example, may be integrated into particular hardware solutions, such as loaded into a suitable filesystem, memory, chip, etc. as part of an SoC design flow so as to comprise a suitable or otherwise sufficient number of IoT-type devices. For example, in some instances, such as for N hardware solutions, N outcomes or starting states may be implemented or achieved, meaning that the N hardware solutions may be capable of providing sufficient or otherwise suitable variability so as to make it less likely or unlikely that two random selected IoT-devices may produce the same outcome (e.g., a random seed, number, etc.), just to illustrate one possible implementation. Thus, at times, a particular production run of an SoC design flow may embed a particular hardware variant into a corresponding IoT-type device, for example, such as to allow for a pool of start-state initialization numbers with an appropriate or otherwise suitable distribution of randomness. At times, these or like hardware solutions may be tested and/or verified, such as part of an SoC design flow, for example, for consistency, start-state initialization numbers, appropriate or otherwise suitable distribution of randomness, or the like. Thus, in operative use, an instruction sequence may take input from a PRNG portion of an LFSR, for example, and may run through a random sequence to produce a seed, which may then be placed into a pseudo-random generator initialization function of an IoT-type device so as to generate one or more start-state initialization numbers. In some instances, an instruction sequence may also be continually evolved, such as via one or more linear genetic programming approaches, for example, so as to generate a new or different seed value every time a random input is called.

Figure 3:
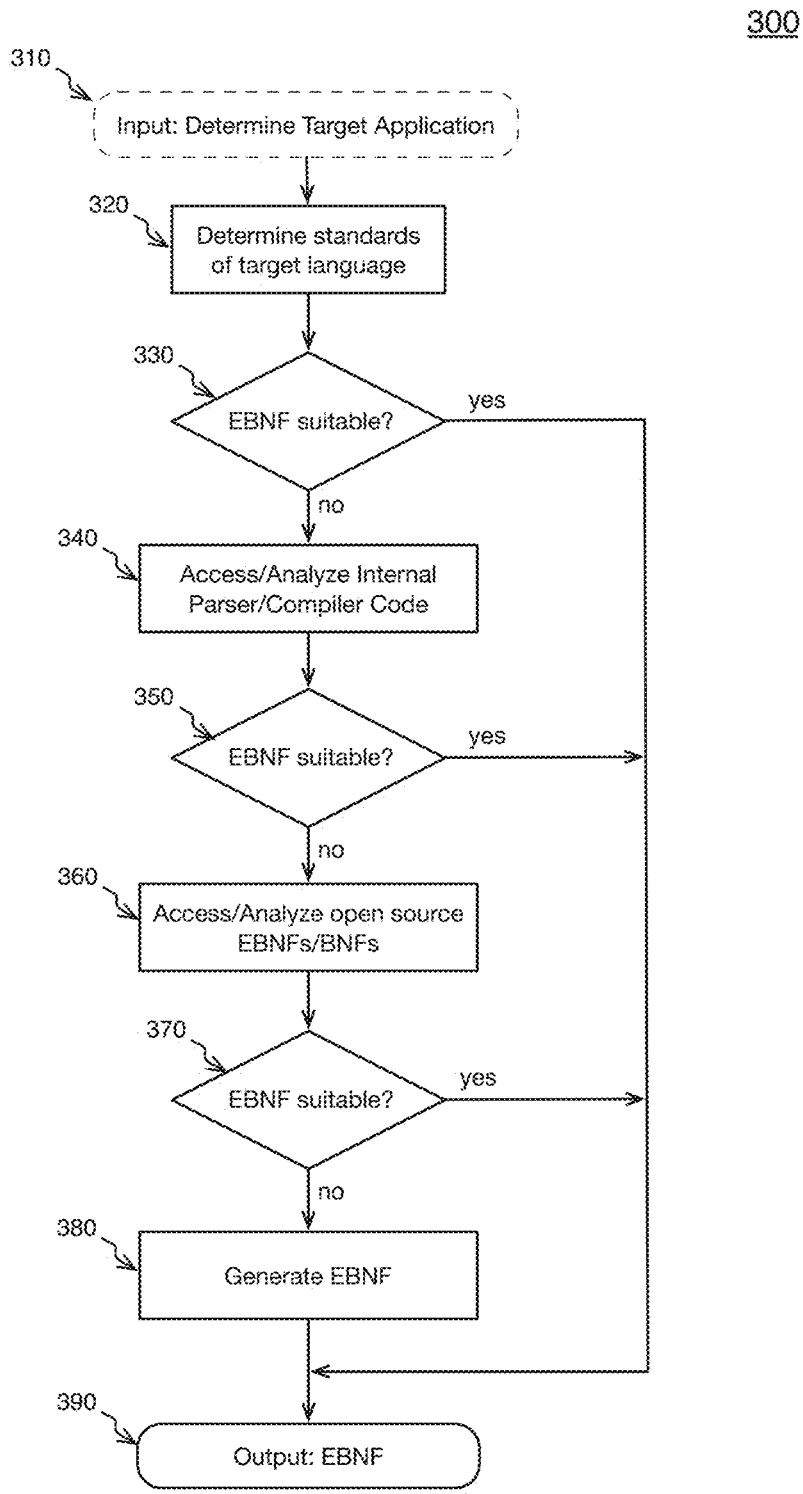
FIG. 3 is a flow diagram illustrating an implementation of an example process for obtaining an EBNF.

Referring now to FIG. 3, which is a flow diagram illustrating an implementation of an example process 300 that may be performed, in whole or in part, to facilitate and/or support one or more operations and/or techniques for an electronic circuit, such as a PRNG, for IoT-type devices, for example. As was indicated, in some instances, example process 300 may be performed, in whole or in part, to obtain an EBNF representation of a particular HDL grammar, such as a Verilog grammar, just to illustrate one possible implementation. Likewise, it should be noted that content acquired and/or produced, such as, for example, input signals, output signals, operations, results, etc. associated with example process 300 may be represented via one or more digital signals. It should also be appreciated that even though one or more operations are illustrated or described concurrently or with respect to a certain sequence, other sequences or concurrent operations may be employed. In addition, although the description below references particular aspects and/or features illustrated in certain other figures, one or more operations may be performed with other aspects and/or features.

Thus, as referenced generally at 310, example process 300 may, for example, begin with determining or defining a target application. For example, as alluded to previously, in some instances, a target application may depend, at least in part, on a nature of a problem to be solved. As was also discussed, in at least one implementation, a target application may comprise, for example, generating a PRNG capable of producing a seed value so as to introduce a sufficient and/or otherwise suitable distribution of randomness into IoT-type devices, such as without reliance on RTCs. At times, determining or defining a target application may also involve determining appropriate synthesis or like tools and/ or aspects, for example, so as to limit a search and/or solution space and also an applicable representation for such a space. For example, in certain simulations or experiments, it has been observed that a proper or suitable grammar to work from may be useful in terms of quality of an output. As was discussed, a grammar typically comprises a set of rules that describe syntax of sentences and expressions in a particular language. Thus, if a grammar for a target language is not correct or otherwise suitable for a target application, for example, it may be difficult to define a structure representative of a solution to a particular problem, which may result in output errors. Also, if a grammar is confusing, poorly documented, etc., then processing such a grammar may be operationally expensive. Thus, it may be useful to determine and/or obtain a sufficiently well-formed grammar that may, for example, be organized in a clearer and/or more consistent way.

Typically, although not necessarily, grammars may specify their rules in a top-down organization. For example, in some instances, top-level, complex items may be listed first, and their pieces are then may be detailed after a rule definition. A number of symbols used in a grammar may be more usefully or suitably defined, such as near the end of the grammar, for example. Thus, a grammar organized in such a way so as to comprise an appropriate candidate for subsequent pruning, such as for a suitable or desired functionality, as discussed below, may be useful. In addition, in some instances, it may be useful to determine if a particular grammar of interest comprises a number of gaps, such as, for example, in the form of rules that are not defined and/or include ill-formed alternatives, rules that are not grammatical, not conforming to applicable rules of a grammar, accepted usage, standards, or the like. Also, it may be useful to implement one or more evaluation operations, such as to determine whether these or like gaps may be suitable or appropriately filled or addressed, such as for a resulting grammar to suitably work for a particular language. By way of example but not limitation, in at least one implementation, it has been determined that, for a particular target application, such as to facilitate and/or support creating PRNGs at a suitable IoT scale, for example, it may be useful to limit or restrict a search space by a BNF representation of a Verilog HDL grammar, for example, such as to implement a suitable or desired functionality. Further, it has also been determined that it may be useful to employ Python due, at least in part, to its handling of variables, content structures, sequencing, object orientation, and/or utilization of a more straightforward syntax similar to natural language, which may facilitate and/or support more effective and/or more efficient utilization of a particular grammatical evolution tool, such as PonyGE2.

Thus, continuing with the above discussion, since a standard or suitable BNF grammar may no longer be available or accessible (e.g., obsolete, outdated, etc.), in some instances, it may, for example, be useful to obtain an EBNF grammar that may be capable of being expressed in the form of a BNF grammar. Since an EBNF grammar may comprise a number of non-standard features in its syntax, for example, it may be useful to determine one or more applicable or appropriate standards that may be applicable or suitable for a target language, such as Verilog, as referenced generally at 320. Thus, here, an input specification, such as stored as one or more digital signals and/or states in memory may, for example, be accessed and evaluated so as to determine compliance with applicable or otherwise suitable language standards. As a way of illustration, on-line content comprising an EBNF standards may, for example, be accessed and analyzed for errors, gaps or omissions, inconsistencies, etc. in an associated grammar so as determine compliance with Verilog standards, for example. In some instances, it may also be useful to determine whether a particular grammar of interest is comprehensive or otherwise suitable for conversion, grammatical evolution, and/or one or more other suitable processes. Thus, since a Python grammar is typically used for a Python parser in conjunction with one or more other supporting files, including a "token" computer file specifying a meaning of symbols available in Python, for example, at times, it may be useful to access such a file for the purpose of determining standards of a target language.

Having determined standards of a target language, example process 300 may proceed to operation 330, for example, so as to determine suitability of an EBNF grammar, which may be based, at least in part, on the determined standards. Thus, as illustrated, if it is determined that a particular EBNF grammar is suitable, such as to facilitate and/or support conversion, grammatical evolution, and/or one or more other suitable processes, example process may proceed to operation 390, such as to output the EBNF grammar for further processing (e.g., at operation 220 of FIG. 2, etc.). However, if it is determined that an EBNF grammar is not suitable, for example, example process 300 may proceed to operation 340, such as to access and/or analyze an applicable internal parser and/or compiler code or instructions for a suitable grammar. For example, since grammars may be used in a parse and/or compilation process, in some instances, it may be useful to access and/or evaluate code of an internal parser and/or compiler to determine whether a given grammar comprises a more complete, accurate, etc. representation of a target language. Thus, as referenced at 350, such a decision may be made, at least in part, via, for example, evaluating a grammar of an internal parser and/or compiler code or instructions for errors, gaps or omissions, inconsistencies, or the like, such as discussed above. Likewise, here, if it is determined that an EBNF grammar is suitable, example process 300 may proceed to operation 390, such as, for example, to output the grammar for further processing.

If no, however, example process 300 may proceed to operation 360, such as to access and/or analyze one or more open source EBNF and/or BNF grammars, if available. For example, in some instances, a target language may not have a suitable grammar, such as in its specification, internal parser and/or compiler code or instructions, or the like. To illustrate, a specification for the LLVM intermediate representation (IR), as one example, includes a grammar that may be readily accessible, but is not labeled as an official grammar due, at least in part, to its sparsity and, as such, may not be suitable for a target language. Thus, in some instances, it may be useful to access and/or analyze a grammar that may have been developed in open source, such as in connection with a particular open source project, for example. It should be noted, however, that, in certain simulations or experiments, it has been observed that open source grammars are typically non-standard, may have different syntax constraints and/or meaning, or the like and, as such, may be error-prone, difficult to process, etc. However, in some instances, such as if one or more open source EBNF and/or BNF grammars are available and/or accessible, these grammars may be evaluated, such as in a manner discussed above, for example, so as to determine their suitability for a target language.

Similarly, here, example process 300 may, for example, implement a decision operation, as referenced at 370, and may output a suitable EBNF grammar via operation 390, such as upon appropriate analysis and/or determination or, alternatively, may proceed to operation 380, at which point a suitable EBNF grammar may be generated, such as via one or more appropriate techniques. For example, in some instances, a suitable EBNF grammar may be generated via a set of instructions defining and/or expressing (e.g., formally, etc.) appropriate symbols (e.g., non-terminal, terminal, start symbols) and production rules, simplifying notation, if suitable or desired, or the like. As was indicated, at times, while generating a suitable EBNF grammar, it may, for example, be useful to implement one or more operations so as to prune the grammar for a desired functionality, such as an LFSR functionality, just to illustrate one possible implementation. It should be noted that, in some instances, it may be useful to generate a BNF grammar, such as instead of an EBNF grammar, for example. In such a case, an operation converting an EBNF grammar to a functionally equivalent or substantially similar BNF grammar, such as implemented in connection of operation 230 of FIG. 2, for example, may be optional. Likewise, here, a generated EBNF grammar may, for example, be outputted, such as for further processing, as referenced generally at 390.

As was indicated, in some instances, it may, for example, be useful to further limit or restrict a search space defined via an EBNF grammar, such as to better or more precise represent a suitable functionality of a target application. In some instances, it may, for example, also be useful to disregard and/or eliminate certain individual LFSR solutions, such as those that may not change after crossover, those that may not produce a new individual LFRS solution after crossover, or the like. Thus, in an implementation, a suitable EBNF grammar may be pruned, such as for an LFSR functionality, for example, which, at times, may facilitate and/or support generation of more tailored, more compact, more fitted, etc. individual LFSR solutions. In this context, "pruning" refers to a process of removing one or more content structures (e.g., trees, subtrees, syntactic items, rules, etc.) that may not be required or otherwise useful for a target application, such as, for example, content structures not required or otherwise useful to implement a particular functionality (e.g., an LFSR functionality, etc.), content structures having duplicate function arguments, etc.

Figure 4:
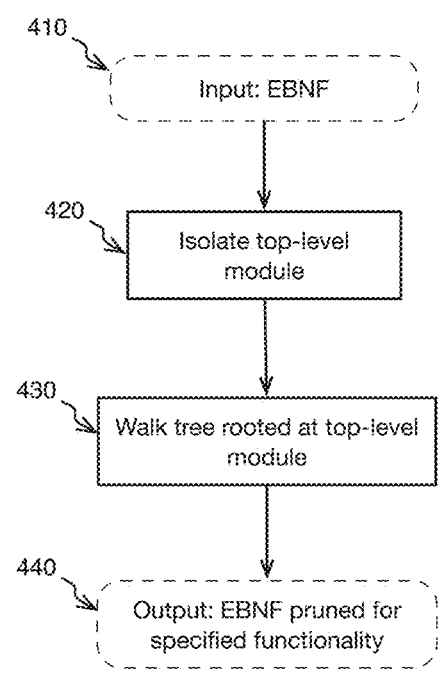
FIG. 4 is a flow diagram illustrating an implementation of an example process for pruning an EBNF for a specified functionality.

Thus, referring now to FIG. 4, which is a flow diagram illustrating an implementation of an example process 400 that may be performed, in whole or in part, to facilitate and/or support one or more operations and/or techniques for pruning an EBNF grammar for an LFSR functionality. As was indicated, in some instances, pruning an EBNF grammar may, for example, be implemented, at least in part, in connection with operation 220 of FIG. 2. Likewise, it should be noted that content acquired or produced, such as, for example, input signals, output signals, operations, results, etc. associated with example process 400 may be represented via one or more digital signals. It should also be appreciated that even though one or more operations are illustrated or described concurrently or with respect to a certain sequence, other sequences or concurrent operations may be employed. In addition, although the description below references particular aspects and/or features illustrated in certain other figures, one or more operations may be performed with other aspects and/or features.

Thus, according to an implementation, while pruning an EBNF for a particular functionality, it may, for example, be useful to isolate one or more syntactic items required or otherwise suitable for that functionality to be available without any unnecessary items retained. For example, as discussed below, a requisite top-most-level structure may be initially isolated. This structure may depend, at least in part, on an implementation and may comprise, for example, a method definition in Python, a class in Java, a module in Verilog, or the like, just to illustrate a few possible examples. In some instances, a rule definition for these or like structures may include, for example, a relatively complex tree of options rooted at them so as to allow for a number of different program structures. Thus, at times, it may be useful to follow lines of corresponding tree structures, for example, and eliminate branches that are unnecessary or less than useful for a particular functionality. To illustrate, if a process is adding two numbers together unconditionally and returning them as an output, for example, rules that describe how to define case statements or "if/else" constructs may be removed or pruned. At times, one or more alternatives from rules may also be removed so as to further prune or limit a search space, for example.

In some instances, such as while following a tree rooted at a top-level structure needed or otherwise useful for a given task, it may be useful, for example, to label or make note regarding which rules are touched during this process. In certain simulations or experiments, it has been observed that these rules may comprise, for example, one or more additional rules that were disconnected from a tree structure. As such, these rules may not be needed or otherwise useful for a particular functionality and, thus, may also be removed or pruned, for example. At times, it may, for example, be useful to add implicit structure to a final grammar, such as once a needed or useful functionality has been isolated. This aspect may depend, at least in part, on a desired functionality and/or target application, for example, and may affect a final output of a grammar.

Thus, with this in mind, according to an implementation, example process 400 may begin at operation 410, such as with using a suitable grammar, such as an EBNF grammar obtained at operation 210 of FIG. 2, for example, as an input. At operation 420, a particular top-level module, such as a top-level Verilog module may, for example, be isolated, as was indicated. In some instances, a top-level Verilog module may comprise, for example, HDL code or a portion thereof, such as defining Verilog syntax constraints via expected behavior inherent to and/or representative of a particular desired functionality, such as an LFSR functionality, just to illustrate one possible implementation. Typically, a Verilog module may comprise, for example, a basic unit of hierarchy, such as descriptive of appropriate boundaries, inputs and/or outputs, behavior (e.g., register transfer level logic, etc.), hierarchical design, or the like. Here, a rule for module declaration may be initially isolated, for example, since a module may serve as a top-level rule during a pruning process. It should be noted that within a Verilog grammar, a module declaration may be initially treated as a top-level rule, for example, so that a number of syntactic items connected to it as a tree root may be sufficiently large. Subsequently, branches of a tree rooted at that root may, for example, be followed and pruned, as appropriate.

Having isolated a top-level Verilog module at operation 420, a tree-walk in a suitable tree structure, such as a tree structure rooted at a top-level module, for example, may be performed as referenced generally at 430. For example, a Verilog module declaration may be connected to a larger number of rules that may offer one or more additional functionalities. However, in some instances, it may, for example, be useful to tree-walk a smaller subset of these rules, such as to obtain an EBNF grammar that may be representative of a specified functionality, such as an LFSR functionality. By way of example but not limitation, a number of general functionalities that may be retained to suitably express or represent a specified functionality, such as an LFSR functionality, in Verilog, for example, may include the following:

Establishing input variables.
Establishing output variables.
Establishing register variables.
Always blocks that trigger on a clock edge or at any change.
Begin/end structures.
If/else constructs.
Assigning to one variable from another variable, including when an assignment is a concatenation of differently sized variables.
Case/endcase constructs, including cases themselves that all contain begin/end blocks.
The ~^, ~, ^, binary operators.
The == Boolean equality operator.
Getting a value of a single index in a variable size register.
An assign statement, including a functionality to include a lambda expression as a conditional assignment.
Syntax for setting a size of a variable to something greater than 1.

It should be noted, however, that these functionalities are provided as non-limiting examples, such as for purposes of illustration of building blocks that, in some instances, may serve as their own roots to trees in an HDL grammar structure, such as a Verilog grammar structure. In addition, to properly express an LFSR, for example, it may be useful, for example, to retain rules that may support one or more of the above functionalities in a pruned version. It may also be useful to ensure that rules reach terminal values, for example, so that they may be properly expressed in a concrete form. Thus, rules that may not be useful to implement an LFSR functionality and/or rules that may not support one or more of the above functionalities may be pruned or removed, for example, even if they are included in a tree rooted at a top-level rule, such as a module declaration. At times, rules that are not a part of this grammar tree may also be removed, for example, as they may lead to an unwanted output. In an implementation, an EBNF grammar pruned for an LFSR functionality may, for example, be outputted, as referenced at 410.

Figure 5:
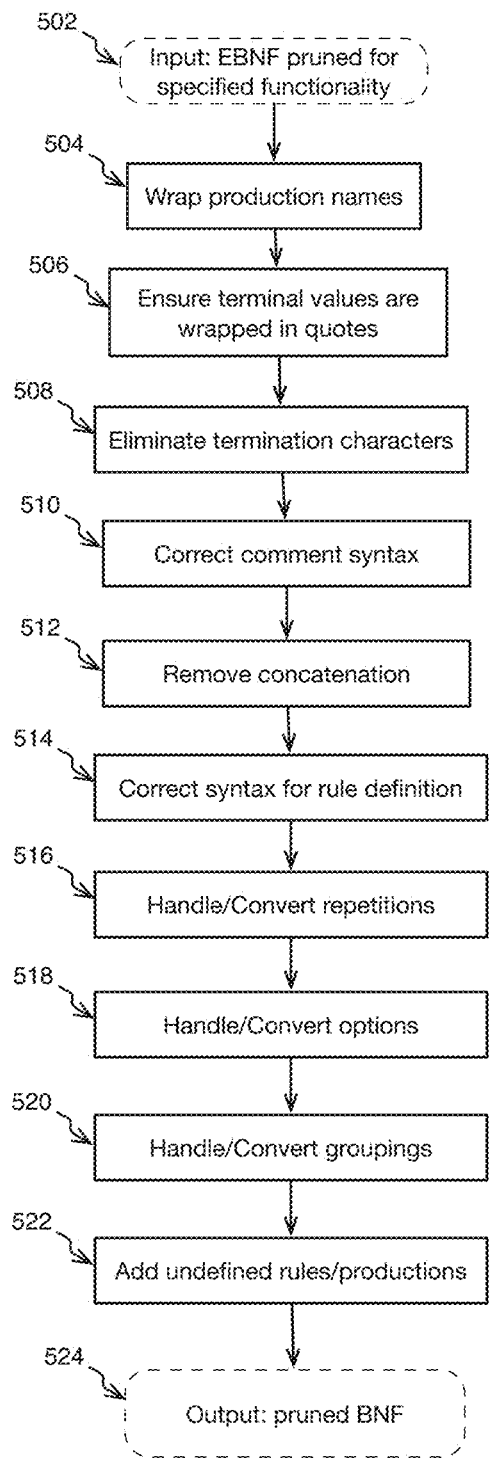
FIG. 5 is a flow diagram illustrating an implementation of an example process for converting an EBNF to a BNF.

FIG. 5 is a flow diagram illustrating an implementation of an example process 500 that may be performed, in whole or in part, to facilitate and/or support one or more operations and/or techniques for converting an EBNF grammar to a BNF grammar. As indicated, example process 500 may be performed, at least in part, in connection with operation 230 of FIG. 2, for example. Likewise, it should be noted that content acquired or produced, such as, for example, input signals, output signals, operations, results, etc. associated with example process 500 may be represented via one or more digital signals. It should also be appreciated that even though one or more operations are illustrated or described concurrently or with respect to a certain sequence, other sequences or concurrent operations may be employed. In addition, although the description below references particular aspects and/or features illustrated in certain other figures, one or more operations may be performed with other aspects and/or features.

Thus, example process 500 may begin, such as at operation 502, for example, with an appropriate input, such as an EBNF pruned for an LFSR functionality. As indicated above, it has been observed that, in some instances, utilizing a grammar expressed via an extended version of Backus-Naur form may be less beneficial or suitable, such as, for example, for facilitating and/or supporting one or more operations or processes for grammatical evolution, among other operations. Thus, at times, it may, for example, be useful to convert a suitable EBNF grammar to a functionally equivalent or substantially similar BNF grammar. As was also discussed, typically, although not necessarily, a BNF grammar may comprise a more concise and/or clear set of rules. For example, BNF's productions or rule names are indicated by a text being wrapped by < > (e.g., <Rule>, <Another-Rule>, etc.). Also, production and rule names may, for example, be used, in whole or in part, within other production bodies as well, such as similarly with their < > wrapping. Further, terminals are contained within double quotes (" ") or single quotes (' '), and different options within a production are separated by the | symbol. A production may be defined via a production name, followed by '::=', for example, and then followed by a body of the production. Comments are typically at the end of a line, for example, and begin with the ';' character.

An EBNF grammar, however, may have a larger number of complex rules. Consider, for example:

TABLE 1

Example EBNF rules.

| Definition | = or: or:=, depending on the type |
|---|---|
| Concatenation | , |

TABLE 1-continued

Example EBNF rules.

| Termination | ; |
|---|---|
| Alternation | \| |
| Optional | [ . . . ] |
| Repetition | { . . . } |
| Grouping | ( . . . ) |
| Terminal String | " . . . " or ' . . . ' |
| Comment | (* . . . *) |
| Special Sequence | ? . . . ? |
| Exception | — |

Additionally, an EBNF's production/rule names are typically not wrapped with the < > symbols, thus, requiring a standard termination character and a different way of marking comments. At times, this aspect may prove to be rather difficult to implement or change to fit into a BNF pattern. As such, with such a large number of EBNF rules, in some instances, it may be desirable or useful to more concisely define a production without an undue number of options within a rule, for example. Thus, as discussed below, in at least one implementation, an EBNF grammar may be converted to a functionally equivalent or substantially similar BNF grammar, such as without changing internals of productions, for example, and/or implementing syntactic changes that may bring a structure of an EBNF grammar more in line with a BNF grammar format.

Thus, according to an implementation, as illustrated via an operation at 504, one or more production rules may, for example, be wrapped. For example, in an EBNF grammar, wrapping production names with < > brackets may be optional. As such, in some instances, operation 504 may also be optional, such as if a given EBNF grammar (e.g., an EBNF grammar inputted at operation 502, etc.) does not contain such brackets, for example. Otherwise, it may, for example, be useful to implement appropriate rule processing, such as to access all applicable or useful rules and, for every token that is not a terminal, wrap it with < >. Since an EBNF rules typically do not contain spaces, in some instances, these rules may, for example, be represented via a single unbroken string of characters.

Example process 500 may then proceed to operation 506 to ensure, such as to analyze and/or determine, for example, that applicable terminal values are wrapped in quotes. For example, in certain simulations or experiments, it has been observed that, in an EBNF grammar, terminal values may be bolded, such as instead of being wrapped in single or double quotes. Additionally, it has been observed that a collection of literals may be indicated via range statements or regex expressions. Thus, for a particular instance of a terminal value, it may, for example, be useful to analyze and/or determine that it is wrapped in either single or double quotes. At times, this may depend, at least in part, on an applicable convention, for example, and/or if quotes are capable of correctly representing inside content (e.g., "'" and '"' are capable of representing single occurrences of the ' and " characters, etc.). In some instances, it may also be useful to enumerate range or regex expressions into all their combinations and/or options, for example.

With regard to operation 508, one or more termination characters may, for example, be eliminated or deleted. For example, in an EBNF grammar, a rule may be terminated by a ';' character, such as due, at least in part, to not wrapping production names. In certain simulations or experiments, it has been observed that these termination characters may not be needed or otherwise useful in a BNF grammar and, as such, may be deleted.

Continuing with the above discussion, at operation 510, comment syntax of an EBNF grammar may, for example be corrected. For example, comments in an EBNF grammar are typically contained within a (* . . . *) structure, while comments within an BNF grammar may be at the end of a line and prepended by a ';' symbol. Thus, here, it may, for example, be useful to access all or applicable comments and, if any are contained within a line (e.g., have effective code both before and after a comment, etc.), split that single line into three, such as with the comment being positioned as the middle line. Then, for all or applicable comments, it may, for example, be useful to remove the prepending (* and replace it with ';'. Here, trailing for *) for all comments may also be removed, such as if appropriate or applicable, so as to facilitate and/or support outputting a grammar that may be more precise and/or easier to process.

In an implementation, at operation 512, concatenation comprising an EBNF grammar may, for example, be removed. For example, an EBNF grammar typically represents concatenation of different elements within a single production option with a ',' symbol. In certain simulations or experiments, however, it has been observed that such concatenation may not be useful for a BNF grammar, such as to implement a desired functionality. As such, here, such concatenation may be removed, for example, and appropriate elements may be listed in a sequential order, such as without a concatenation symbol.

With regard to operation 514, syntax for an EBNF rule definition may, for example, be corrected. For example, in an EBNF grammar, a standard notation for the beginning of a definition of a rule after a rule name has been stated is '='. However, in a particular simulation or experiment, it has been observed that this notation may be marked with a different set of characters, such as, for example, ":=", ":", "::==", "::=". It has also been observed that, in a BNF grammar, it may, for example, be useful to represent this notation via "::=". Thus, in some instances, it may be useful, for example, to analyze and/or determine that all or suitable instances of a definition notation are compliant with a BNF standard of "::=".

According to an implementation, example process 500 may further proceed to operation 516, during which repetitions may, for example, be handled, such as processed and/or converted. Typically, although not necessarily, repetitions in an EBNF grammar are represented via the following structure: '{ . . . }'. In this context, a "repetition" refers to one or more elements within curly braces that is being allowed to appear an arbitrary number of time, including not at all. For example, if within a rule there is a statement of '{<option>}' then the result of that production may contain 0, 1, or more instances of <option>. For a particular occurrence of this structure, a new rule may, for example, be created and/or appropriately labeled. For example, in some instances, it may be useful to label a new production with a name that includes an original name of items appearing within it with "_repetition" added at the end. A new rule may have three options for its body, such as, for example:

Empty or ' '

A single occurrence of items within a repetition.

A single occurrence of items within a repetition and a recursive call to a new rule.

According to an implementation, a new rule may, for example, replace repetition syntax in a rule that contains a repetition. Thus, consider, for example:
Original Rule:
<rule>::=<constant> "terminal" {<parameter>}
New Rule(s):
<rule>::=<constant> "terminal" <parameter_repetition>
<parameter_repetition>::=' '|<parameter>=1<parameter> <parameter_repetition>

In some instances, this may, for example, facilitate and/or support expressing the same or similar functionality as repetition syntax in an EBNF grammar, but with tools available in and/or applicable to a BNF grammar. It should be noted that, once a new rule is defined, it may, for example, be useful to replace a given repetition with its rule counterpart so as to avoid creating duplicate productions.

Continuing with example process 500, at operation 518, one or more options may, for example, be handled, such as processed and/or converted. For example, syntax for an option in an EBNF grammar may comprise a text contained within a '[ . . . ]' construction. In some instances, an option syntax may, for example, indicate that items within the brackets may appear 0 or 1 times. To address this, at times, a process, such as similar to a process handling repetition discussed above may, for example be employed, in whole or in part. To illustrate, for a particular option, a new rule that may have two options within a body, such as one of them being empty and the other being a single instance of an inside of an option structure, for example, may be created. Similarly, any suitable rule name may be used herein, but, in some instances, it may be useful to label a new production with a name indicative of what is inside a particular option, for example, and adding "_option" at the end. Thus, consider, for example:
Original Rule:
<rule>::=<constant> [<name-parameter>] "terminal"
New Rule(s):
<rule>::=<constant> <name-parameter_option> "terminal"
<name-parameter_option>::=' '|<name-parameter>

Likewise, in some instances, generating new rules via this approach may facilitate and/or support expressing the same or similar functionality, such as partially or substantially, as option syntax in an EBNF grammar, for example, but with tools available in and/or applicable to a BNF grammar. Similarly, here, it should be noted that, once a new rule is defined, it may be useful to replace a given repetition with its rule counterpart, for example, so as to avoid creating duplicate productions. For example, in at least one implementation, two options from a single option in an original rule may be created, such as to avoid creating another rule entirely. In such a case, such as if a specific option is used in several places, for example, it may be useful to replace those instances of the option with a new rule.

As further illustrated, example process 500 may proceed to operation 520, for example, such as to process, such as handle and/or convert one or more applicable groupings. Typically, although not necessarily, a grouping in an EBNF grammar is represented by the '( . . . )' syntax in which a body of the grouping comprises a collection of items separated by '|' characters. While inside a grouping, for example, one of the items may be expressed at a time. For a particular grouping, depending on an implementation, the following approaches may, for example, be utilized, in whole or in part, or otherwise considered:

An alternate within an existing rule may be made, such as for a particular option in a grouping, where the alternate has only one of the options included in it; and/or A new rule that has a body identical to the inside of the original grouping may be created.

Thus, consider, for example:

Original Rule:

<rule>::=<test> (<option1>|<option2>|<option3>)

New Rule with Added Alternatives:

<rule>::=<test> <option1>|<test> <option2>|<test> <option3>

New Rules when an Additional Rule is Created:

<rule>::=<test> <option1-option2-option3_grouping>
<option1-option2-option3 grouping>::= <option1>|<option2>|<option3>

In an implementation, such as depending, at least in part, on what is in a body of a rule to be adapted, it may be useful to add a new rule, such as instead of adding alternatives to an existing rule, for example. In some instances, such as if a new rule is generated, for example, it may also be useful to indicate options in a grouping and append "_grouping" at the end of the rule name.

With regard to operation 522, appropriate undefined rules or productions may, for example, be added. As was indicated, in some instances, an EBNF grammar for a target application may be incomplete, such as having rules that are used in a body of some other rule, but that rule is not defined in any other part of a specification or some content. For example, in certain simulations or experiments, it has been observed that a larger number of terminal options for a single rule may be expressed without enumerating all of them. At times, this may involve, for example, interpreting what a particular rule represents and/or defining it for a BNF converter. To illustrate, a standard Verilog EBNF has rules that are not defined, such as, for example, <Any_ASCII_character>, <Any_ASCII_character_except_white_space>, an <Any_ASCII_character_except_new_line>, or the like. These or like rules may indicate what a corresponding rule may contain, for example, and defining it may involve introducing every applicable ASCII character, at times, with exceptions, if appropriate. In some instances, this may facilitate and/or support converting a non-standard, incomplete, inaccurate, etc. EBNF grammar into a BNF grammar that may be standard-compliant, more effective and/or more efficient to process, or the like, as was indicated.

In certain simulations or experiments, it has also been observed that an EBNF grammar may comprise special characters, such as characters contained within the '? . . . ?' structure, for example. Generally, these or like special characters may not necessarily be comments, for example, and may be outside the scope of a typical EBNF standard. At times, these or like special characters may be included as a marker, for example, but, to implement these special characters, it may be useful to generate a new collection of rules to represent meaning of these or like special characters.

In some instances, such as optionally or alternatively, an augmented BNF (ABNF) grammar may, for example, be utilized herein, in whole or in part, or otherwise considered. It should be noted that one or more syntactical elements of such an ABNF, however, may be incompatible with those of a BNF grammar. As such, here, an ABNF may be used, at least in part, for protocols specifications, such as similarly to an EBNF, for example, but may have different notations for choice, option, and/or repetition, for example. As a way of illustration, for implementation purposes, some of the differences are illustrated below. Thus, consider, for example:

|  | EBNF Notation | ABNF Notation |
|---|---|---|
| Choice | \| | / |
| Repetition | { expansion } | *( expansion ) |

At times, an ABNF may also specify, for example, upper and/or lower bounds on a number of repetitions allowed for a syntactic item. For example, a repetition to be repeated n or more times may be preceded by n*. Further, a repetition to be repeated between n and m times may, for example, be preceded by n*m. As such, here, conversion from an ABNF grammar to a BNF grammar may, for example, be implemented, in whole or in part, in a manner similar to conversion from an EBNF grammar to a BNF grammar, as discussed above, while accounting for these or like differences.

As illustrated at 524, a suitable BNF grammar, such as a BNF grammar that may be functionally equivalent or substantially similar to an inputted EBNF grammar (e.g., at operation 502, etc.) may, for example, be outputted, at which point example process 500 may terminate. As indicated above, in an implementation, such a BNF grammar that may comprise, for example, a subset of an HDL grammar, such as a Verilog BNF grammar, that focuses on a particular area, such as an LFSR area, may be simpler to process (e.g., parse, compile, etc.), may be primed for use in a number of tools, such as for grammatical evolution applications, and/or the like.

Figure 6:
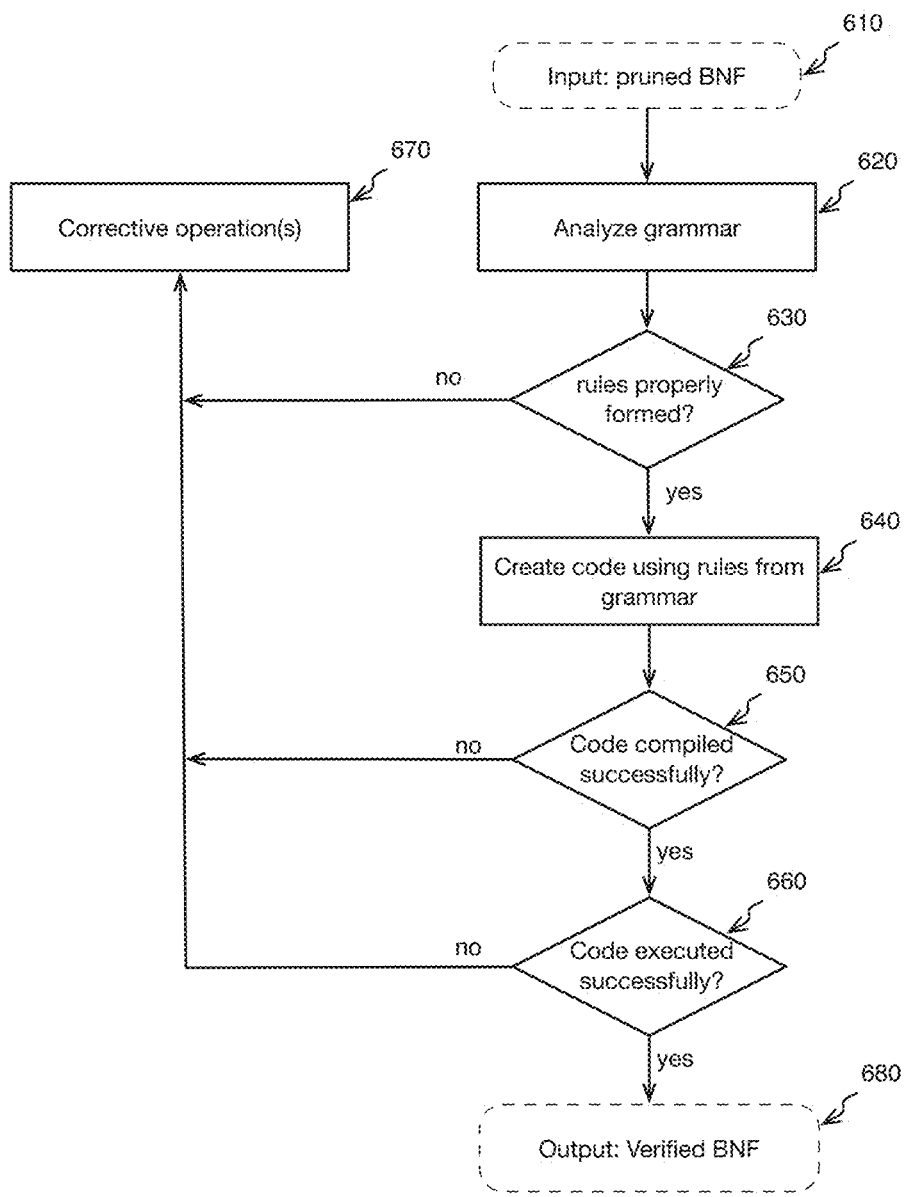
FIG. 6 is a flow diagram illustrating an implementation of an example process for verification of a BNF.

FIG. 6 is a flow diagram illustrating an implementation of an example process 600 that may be performed, in whole or in part, to facilitate and/or support one or more operations and/or techniques for verifying syntactic correctness of a BNF grammar. As discussed herein, such as in connection with operations 240 and/or 280 of FIG. 2, for example, in some instances, it may, for example, be useful to verify correctness and/or validity of an outputted BNF grammar. For example, as was indicated, here, the PonyGE2 tool, accessible at https://github.com/PonyGE/PonyGE2, may be utilized, in whole or in part. As was also discussed, since PonyGE2 is built in Python, it has support for grammatical evolution of Python syntax. More specifically, it may allow to make outputted code more effective and/or more efficient, such as for processing, for example, by parsing code breaks and/or making ranges in a grammar to be more concisely expressed. Likewise, it should be noted that content acquired or produced, such as, for example, input signals, output signals, operations, results, etc. associated with example process 600 may be represented via one or more digital signals. It should also be appreciated that even though one or more operations are illustrated or described concurrently or with respect to a certain sequence, other sequences or concurrent operations may be employed. In addition, although the description below references particular aspects and/or features illustrated in certain other figures, one or more operations may be performed with other aspects and/or features.

Example process 600 may begin at operation 610, utilizing a pruned BNF grammar as input, for example. In an implementation, a BNF grammar outputted at operation 524 of FIG. 5, for example, may be utilized as an input to example process 600. Continuing with example process 600, as referenced at operation 620, at least in part responsive to obtaining a pruned BNF grammar, such as a subset of a Verilog BNF grammar that focuses on a particular area, such as an LFSR area, for example, the BNF grammar may be analyzed. For example, as mentioned, one or more software-based tools, such as PonyGE2, for example, may be utilized to analyze a BNF grammar. In general, a BNF grammar may be analyzed to verify the grammar for syntactical correctness and/or to ensure that the BNF grammar is an accurate representation of a target language, for example. As was indicated, after converting an EBNF grammar to a BNF grammar, there may be issues with the grammar that may make it insufficient and/or otherwise unsuitable for use in creating and/or verifying code. Further, for example, mistakes may be made while editing a BNF grammar for functionality and/or while editing for better formed rules.

As indicated generally at 630, a determination may be made as to whether one or more rules for a particular BNF grammar have been properly formed. As was indicated, if a particular BNF grammar is not properly formed, for example, uses of the grammar may yield unsatisfactory outcomes. In particular implementations, various approaches may be utilized to verify whether rules are properly formed for a particular BNF grammar. In an implementation, for example, a subset of a tailored and/or otherwise specified Verilog BNF grammar may be fed, such as used as an input, for example, into a suitable grammatical evolution tool to verify that the rules are properly formed. For example, in an implementation, PonyGE2 may follow grammatical paths, such as from a particular rule to rules within the particular rule, for example, until particular paths reach terminal values. Further, for example, PonyGE2 may detect circular rules that may, as was indicated, be problematic at least in part because any code generated from such grammar may result in an infinite cycle of rules. Example operations and/or processes that may be performed with respect to various rules are described above, for example, in connection with example operations 210, 220 and/or 230 and/or in connection with example processes 200, 300, 400 and/or 500. As mentioned, example process 400 may pertain to pruning an EBNF, such as for a specified functionality, for example. Further, in an implementation, example process 500 may pertain to converting an EBNF grammar to a BNF grammar. Additionally, as indicated, example process 600 may pertain to testing and/or executing a well-formed BNF to generate output code, in an implementation. Thus, in an implementation, example processes 400 and 500 may involve design decisions and example process 600 may relate to implementation of a design.

As further indicated generally at 670, responsive at least in part to a determination that a BNF has not been satisfactorily verified, example process 600 may proceed to operation 670 which may, for example, include one or more operations to correct the BNF. In an implementation, corrective operations may include operations 210, 220 and/or 230 and/or example processes 200, 300, 400 and/or 500, for example. Of course, claimed subject matter is not limited in scope in these respects.

Continuing with example process 600, as referenced at operation 640, syntactic correctness of a BNF grammar may be verified at least in part via generating code utilizing rules included by the grammar. In an implementation, only rules from the particular grammar may be utilized in generating the code. Further, in an implementation, as indicated generally at 650, a determination may be made as to whether the generated code can be compiled successfully. As further indicated generally at operation 660, a determination may be made as to whether successfully compiled code can be executed successfully. As was indicated, a particular code sample may not perform any particular function in some instances. However, if the code compiles as expected and also executes as expected, the grammar may be determined to successfully describe a context-free version of the grammar. In general, determinations that grammar rules have been properly formed, that code generated from the grammar compiles successfully and/or correctly and/or that the compiled code executes successfully and/or correctly may indicate that the BNF has been satisfactorily verified, as referenced generally at 680. In an implementation, a BNF grammar may be determined to have been satisfactorily verified if a generated HDL code segment (e.g., Verilog code segment) does not violate any specified constraints for a particular HDL (e.g., Verilog). For example, if a BNF grammar can be compiled without syntactical errors to Register Transfer Logic (RTL), the BNF grammar may be determined to have been successfully verified.

Figure 7:
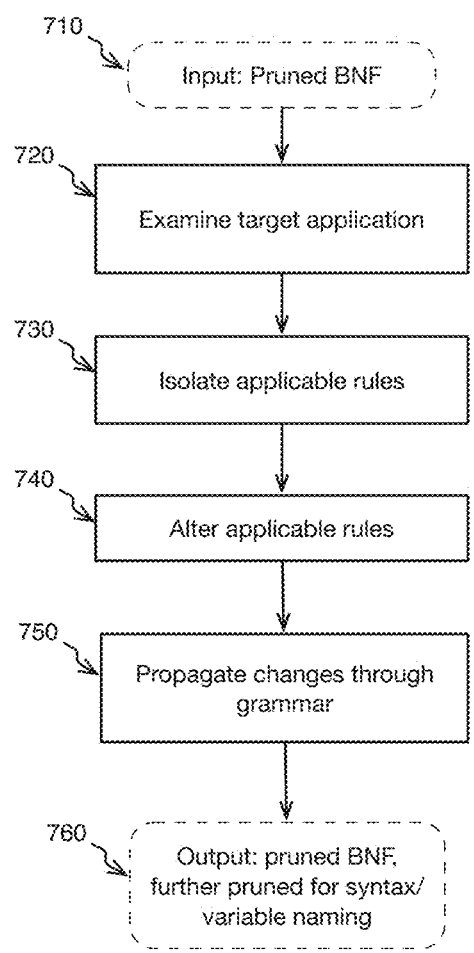
FIG. 7 is a flow diagram illustrating an implementation of an example process for further pruning of a pruned BNF.

Referring now to FIG. 7, which is a flow diagram illustrating an implementation of an example process 700 that may be performed, in whole or in part, to facilitate and/or support one or more operations and/or techniques for further pruning a BNF grammar for syntax and/or variable naming. In some implementations, example process 700 may be implemented, at least in part, in connection with operations 260 and/or 270 of FIG. 2, for example. Likewise, it should be noted that content acquired or produced, such as, for example, input signals, output signals, operations, results, etc. associated with example process 700 may be represented via one or more digital signals. It should also be appreciated that even though one or more operations are illustrated or described concurrently or with respect to a certain sequence, other sequences or concurrent operations may be employed. In addition, although the description below references particular aspects and/or features illustrated in certain other figures, one or more operations may be performed with other aspects and/or features.

As was indicated, EBNFs and/or BNFs may be context-free, in that they may refer to changes in syntactic structure of code segments but not to elements therein for semantic correctness. If it is desired to include such context in a grammar and/or if it is desired that the grammar to exhibit at least a measure of semantic consistency, the grammar may be further edited to include such context. In an implementation, a copy of a BNF may be created and/or stored prior to additional editing to provide a canvass for generating different versions of more structured grammars.

In an implementation, one or more operations for further pruning a BNF grammar for syntax and/or variable naming may be based, at least in part, on a particular end use of the grammar and/or on particular specifications for a particular application. For example, if only particular specific aspects of an HDL code are meant to be changed, then one or more operations may be performed to edit and/or prune the grammar according to the particular specific aspects. Depending on a particular application, some or even much of a grammar pruned in accordance with other operations, such as operations 220 and/or 230 and/or example processes 400 and/or 500, for example, may be edited, such as heavily edited, or even removed, in an implementation. However, claimed subject matter is not limited in scope in these respects.

In an implementation, rules for a BNF grammar may be further isolated, assessed and/or edited to implement additional syntactic constraints beyond those imposed by other operations, such as operations 210, 220 and/or 230 and/or example processes 400 and/or 500, for example. Example process 700 may begin at operation 710, utilizing a pruned BNF grammar as input, for example. As was indicated, a pruned BNF grammar may be verified for syntactic correctness, such as discussed above in connection with example process 600, for example. Continuing with example process 700, as referenced at operation 720, at least in part responsive to obtaining a pruned and/or verified BNF, a target application may be examined, such as to identify structures that may be consistent across various and/or all versions of a target application. For example, other operations involving pruning and/or otherwise editing a grammar, such as operations 210, 220 and/or 230, for example, may isolate particular functionality without adding context for a particular application. For operation 720, in an implementation, syntactic structures may be identified for a particular application, and such structures may be fixed within a grammar to provide context.

Example process 700 may continue to operation 730, wherein applicable rules may be isolated and/or otherwise identified, in an implementation. For example, at least in part in response to identifying syntactic structures to be constrained, such as structures identified at operation 720, for example, one or more rules, such as top-level rules, for example, that may describe functionality related to the identified syntactic structures may be isolated and/or otherwise identified. Further, in an implementation, additional rules may be isolated and/or otherwise identified, including, for example, rules that may be affected by changes to other isolated and/or otherwise identified rules. Such additional rules may include, for example, rules that may utilize other rules to be changed and/or rules that may be utilized by other rules to be changed, for example.

Example process 700 may continue to operation 740, wherein applicable rules, such as those isolated and/or otherwise identified at operation 730, for example, may be altered. For example, as was indicated, isolated and/or otherwise identified rules may be altered to inject context for a particular application into a BNF grammar. Depending at least in part on the particular characteristics of a particular application, particular changes to be made and/or a particular scope of changes to be made may vary significantly in some instances and/or may have significant implications for a particular grammar, for example.

In some circumstances, again, depending at least in part on particular characteristics of a particular application, alterations to applicable rules for a particular grammar may be relatively simple. For example, in a particular implementation, a particular rule may be replaced with a terminal value and/or one or more portions of a rules definition may be removed to limit a search space for that rule. Of course, these are merely a couple of non-limiting examples of changes that may be made to one or more rules, and claimed subject matter is not limited in scope in these respects. Further, rules may be altered in a variety of ways, in an implementation. Particular options for alterations to rules may depend at least in part on characteristics of a particular application and/or on a particular syntax structure, for example.

In an implementation, for a circumstance in which a rule may have multiple contexts within a particular application, one or more duplicate rules may be generated having different contexts. For some constrained constructs, such as conditional loops for specific portions of an application, multiple duplicates may be generated, for example. In an implementation, duplicates of a particular rule may be generated in advance of editing the particular rule for a particular context. Again, claimed subject matter is not limited in scope in these respects.

Example process 700 may continue to operation 750, wherein alterations to particular rules, such as rules altered in connection with operation 740, may be propagated through a grammar. For example, alterations made at operation 740 may lead to changes in subsequent rules that either utilize an altered rule and/or are utilized by an altered rule. In an implementation, changes to subsequent rules may be based at least in part on a particular application for which a grammar is being pruned and/or at least in part on changes particular rules made previously.

In circumstances in which duplicate rules are generated, such as was indicated in connection with operation 740, for example, an assessment may be made as to which rules should be altered to reference particular duplicate rules. In an implementation, additional duplicates of one or more rules may be generated to accommodate rules altered previously, such as in connection with operation 740, for example. A similar and/or recursive process for altering and/or duplicating rules may be employed to propagate rules changes through a grammar as may be used in connection with operation 740, for example. A process for propagating rules changes through a grammar may be repeated recursively, for example, until there remain no additional rules to be altered based on a group of rules altered at operation 740, in an implementation.

In addition to pruning and/or editing a grammar to build in context of particular syntactic structures, it may be advantageous in some circumstances to prune and/or edit a grammar for variable naming, as was indicated previously. While operations 710 through 760 have been described in terms of syntactic structures to be edited with a particular application in mind, additional operations similar to those described in connection with operations 710 through 760 to make alterations to particular terminal values, such as, for example, numerical values, string values, etc., in an implementation. Similar to operations involving alteration of rules described above in connection with operations 710 through 760, operations to alter terminal values, for example, may depend on particular characteristics of a particular application.

For example, referring again to operation 720, a target application may be examined, such as to identify constant values that may be consistent across various and/or all versions of a target application. For example, variables that may be replaced with constant values may be identified. Identification of particular variables to be replaced by constant values and/or identification of variable names that may be fixed to a particular string value may depend, at least in part, on a particular application. Further, referring again to operation 730, responsive at least in part to identification of variable names and/or constants to be constrained, particular rules, such as top-level rules, that describe usage of such identified variable names and/or constants may be isolated and/or otherwise identified. As was indicated, additional rules may be isolated and/or otherwise identified, including, for example, rules that may be affected by changes to other rules.

Referring again to operation 740, applicable rules, such as those isolated and/or otherwise identified at operation 730, for example, may be altered. Depending at least in part on the particular characteristics of a particular application, particular changes to be made and/or a particular scope of changes to be made may vary significantly in some instances and/or may have significant implications for a particular grammar, for example. In some circumstances, again, depending at least in part on particular characteristics of a particular application, alterations to applicable rules for a particular grammar may be relatively simple. For example, in a particular implementation, a particular random string may be replaced by a fixed string. Of course, this is merely an example of a change that may be made to one or more rules related to variable names and/or constants, and claimed subject matter is not limited in scope in these respects. As illustrated at 750, a suitable BNF grammar, such as a BNF grammar pruned for syntax and/or variable naming, may, for example, be outputted, at which point example process 700 may terminate. In an implementation, example process 700 may involve removing rules that may not apply to a particular application and/or specified functionality, thereby focusing a particular BNF grammar on the particular application and/or specified functionality at issue. Termination of example process 700 may occur, for example, one the BNF grammar is defined in a sufficiently expressive manner to as to produce code that satisfies one or more particular constraints related to the particular application and/or specified functionality.

As discussed herein, one or more operations and/or techniques for a pseudo-random number generator (PRNG) for IoT-type devices, to name one example electronic circuit type, may provide benefits. For example, utilizing one or more approaches discussed above, a PRNG for particular IoT-type devices, such as peripheral or end-point and/or resource-constrained embedded devices, just to illustrate a few examples, may be created. In some instances, such a PRNG may be capable of producing a seed value, such as without reliance on an RTC, for example, that may introduce a sufficient or otherwise suitable amount and/or distribution of randomness into IoT-type devices so as to preclude or reduce readable and/or predictable patterns. As was indicated, a PRNG may, for example, also be capable of saving power through execution on-demand. In addition, removal of an RTC may also significantly save power on particular IoT-type devices, such as IoT-type devices operating in resource constrained or like environments, for example. As was also discussed, random numbers may be critical for a wide number of applications including security, statistical sampling, on-line gaming, or the like. A field of cryptography may utilize random numbers generated in connection with a PRNG, such as discussed herein, to create unique keys, for example, statistical sampling may be capable to use such a PRNG to select simple random samples, on-line gaming may benefit by employing such a PRNG to provide non-linear changes in game patterns, or the like. Of course, such a description of certain aspects of an autonomous pseudo-random seed generator and its benefits is merely an example, and claimed subject matter is not so limited.

Also discussed herein are example approaches to verifying autonomously generated HDL code, such as Verilog code. As mentioned, for example, a grammatical evolution process may generate evolved HDL code, such as Verilog code. Evolved HDL code may be verified via a process utilizing BNF input grammar to perform at least part of the verification, for example. Thus, in an implementation, a subset of Verilog generated as part of a grammatical evolution process may be proven against a Verilog BNF definition. Thus, BNF grammar may describe the search-space language and may further provide at least partial verification of an evolved Verilog solution. Additionally, as was indicated, further tailoring inputted BNF beyond rules obtained from a full Verilog BNF grammar may help ensure that an eventual outputted solution has particular advantageous characteristics that may depend, at least in part, on a particular application. Utilizing such an example approach, an increase in efficiency and/or efficacy with respect to verification of evolved Verilog code may be achieved.

As further discussed herein, a BNF grammar may serve as an example template for a target application and/or may be utilized to verify existing HDL code. Utilizing a particular grammar template, an example instance of a particular application may be tested against the particular template to determine whether a particular evolved HDL solution is compatible and/or compliant with the specifications of the grammar. Further, a grammar template may be utilized to create different versions of a particular application, such as to mitigate security concerns in situations wherein multiple instances of a particular application share the same HDL code, for example.

In the context of the present disclosure, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other electrical conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications, as discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" may be understood to mean indirectly connected in an appropriate context. It is further noted, in the context of the present disclosure, the term physical if used in relation to memory, such as memory components or memory states, as examples, necessarily implies that memory, such memory components and/or memory states, continuing with the example, is tangible.

Additionally, in the present disclosure, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If, alternatively, reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

With advances in technology, it has become more typical to employ distributed computing and/or communication approaches in which portions of a process, such as signal processing of signal samples, for example, may be allocated among various devices, including one or more client devices, one or more server devices and/or one or more peer-to-peer devices, via a computing and/or communications network, for example. A network may comprise two or more devices, such as network devices and/or computing devices, and/or may couple devices, such as network devices and/or computing devices, so that signal communications, such as in the form of signal packets and/or signal frames (e.g., comprising one or more signal samples), for example, may be exchanged, such as between a server device, a client device and/or a peer-to-peer device, as well as other types of devices, including between wired and/or wireless devices coupled via a wired and/or wireless network, for example.

An example of a distributed computing system comprises the so-called Hadoop distributed computing system, which employs a map-reduce type of architecture. In the context of the present disclosure, the terms map-reduce architecture and/or similar terms are intended to refer to a distributed computing system implementation and/or embodiment for processing and/or for generating larger sets of signal samples employing map and/or reduce operations for a parallel, distributed process performed over a network of devices. A map operation and/or similar terms refer to processing of signals (e.g., signal samples) to generate one or more key-value pairs and to distribute the one or more pairs to one or more devices of the system (e.g., network). A reduce operation and/or similar terms refer to processing of signals (e.g., signal samples) via a summary operation (e.g., such as counting the number of students in a queue, yielding name frequencies, etc.). A system may employ such an architecture, such as by marshaling distributed server devices, executing various tasks in parallel, and/or managing communications, such as signal transfers, between various parts of the system (e.g., network), in an embodiment. As mentioned, one non-limiting, but well-known, example comprises the Hadoop distributed computing system. It refers to an open source implementation and/or embodiment of a map-reduce type architecture (available from the Apache Software Foundation, 1901 Munsey Drive, Forrest Hill, Md., 21050-2747), but may include other aspects, such as the Hadoop distributed file system (HDFS) (available from the Apache Software Foundation, 1901 Munsey Drive, Forrest Hill, Md., 21050-2747). In general, therefore, "Hadoop" and/or similar terms (e.g., "Hadoop-type," etc.) refer to an implementation and/or embodiment of a scheduler for executing larger processing jobs using a map-reduce architecture over a distributed system. Furthermore, in the context of the present disclosure, use of the term "Hadoop" is intended to include versions, presently known and/or to be later developed.

In the context of the present disclosure, the term "network device" refers to any device capable of communicating via and/or as part of a network and may comprise a computing device. While network devices may be capable of communicating signals (e.g., signal packets and/or frames), such as via a wired and/or wireless network, they may also be capable of performing operations associated with a computing device, such as arithmetic and/or logic operations, processing and/or storing operations (e.g., storing signal samples), such as in a non-transitory memory as tangible, physical memory states, and/or may, for example, operate as a server device and/or a client device in various embodiments. Network devices capable of operating as a server device, a client device and/or otherwise, may include, as examples, dedicated rack-mounted servers, desktop computers, laptop computers, set top boxes, tablets, netbooks, smart phones, wearable devices, integrated devices combining two or more features of the foregoing devices, and/or the like, or any combination thereof. As mentioned, signal packets and/or frames, for example, may be exchanged, such as between a server device and/or a client device, as well as other types of devices, including between wired and/or wireless devices coupled via a wired and/or wireless network, for example, or any combination thereof. It is noted that the terms, server, server device, server computing device, server computing platform and/or similar terms are used interchangeably. Similarly, the terms client, client device, client computing device, client computing platform and/or similar terms are also used interchangeably. While in some instances, for ease of description, these terms may be used in the singular, such as by referring to a "client device" or a "server device," the description is intended to encompass one or more client devices and/or one or more server devices, as appropriate. Along similar lines, references to a "database" are understood to mean, one or more databases and/or portions thereof, as appropriate.

It should be understood that for ease of description, a network device (also referred to as a networking device) may be embodied and/or described in terms of a computing device and vice-versa. However, it should further be understood that this description should in no way be construed so that claimed subject matter is limited to one embodiment, such as only a computing device and/or only a network device, but, instead, may be embodied as a variety of devices or combinations thereof, including, for example, one or more illustrative examples.

A network may also include now known, and/or to be later developed arrangements, derivatives, and/or improvements, including, for example, past, present and/or future mass storage, such as network attached storage (NAS), a storage area network (SAN), and/or other forms of device readable media, for example. A network may include a portion of the Internet, one or more local area networks (LANs), one or more wide area networks (WANs), wire-line type connections, wireless type connections, other connections, or any combination thereof. Thus, a network may be worldwide in scope and/or extent. Likewise, sub-networks, such as may employ differing architectures and/or may be substantially compliant and/or substantially compatible with differing protocols, such as network computing and/or communications protocols (e.g., network protocols), may interoperate within a larger network.

In the context of the present disclosure, the term sub-network and/or similar terms, if used, for example, with respect to a network, refers to the network and/or a part thereof. Sub-networks may also comprise links, such as physical links, connecting and/or coupling nodes, so as to be capable to communicate signal packets and/or frames between devices of particular nodes, including via wired links, wireless links, or combinations thereof. Various types of devices, such as network devices and/or computing devices, may be made available so that device interoperability is enabled and/or, in at least some instances, may be transparent. In the context of the present disclosure, the term "transparent," if used with respect to particular communicating devices of a network, refers to the devices communicating via the network in which the devices are able to communicate via one or more intermediate devices, such as of one or more intermediate nodes, but without the communicating devices necessarily specifying the one or more intermediate nodes and/or the one or more intermediate devices of the one or more intermediate nodes. Thus, a network may include the one or more intermediate nodes and/or the one or more intermediate devices of the one or more intermediate nodes in communications and the network may engage in communications via the one or more intermediate nodes and/or the one or more intermediate devices of the one or more intermediate nodes, but the network may operate as if such intermediate nodes and/or intermediate devices are not necessarily involved in communications between the particular communicating devices. For example, a router may provide a link and/or connection between otherwise separate and/or independent LANs.

In the context of the present disclosure, a "private network" refers to a particular, limited set of devices, such as network devices and/or computing devices, able to communicate with other devices, such as network devices and/or computing devices, in the particular, limited set, such as via signal packet and/or signal frame communications, for example, without a need for re-routing and/or redirecting signal communications. A private network may comprise a stand-alone network; however, a private network may also comprise a subset of a larger network, such as, for example, without limitation, all or a portion of the Internet. Thus, for example, a private network "in the cloud" may refer to a private network that comprises a subset of the Internet. Although signal packet and/or frame communications (e.g. signal communications) may employ intermediate devices of intermediate nodes to exchange signal packets and/or signal frames, those intermediate devices may not necessarily be included in the private network by not being a source or designated destination for one or more signal packets and/or signal frames, for example. It is understood in the context of the present disclosure that a private network may direct outgoing signal communications to devices not in the private network, but devices outside the private network may not necessarily be able to direct inbound signal communications to devices included in the private network.

The Internet refers to a decentralized global network of interoperable networks that comply with the Internet Protocol (IP). It is noted that there are several versions of the Internet Protocol. The term Internet Protocol, IP, and/or similar terms are intended to refer to any version, now known and/or to be later developed. The Internet includes local area networks (LANs), wide area networks (WANs), wireless networks, and/or long haul networks that, for example, may allow signal packets and/or frames to be communicated between LANs. The term World Wide Web (WWW or Web) and/or similar terms may also be used, although it refers to a part of the Internet that complies with the Hypertext Transfer Protocol (HTTP). For example, network devices may engage in an HTTP session through an exchange of appropriately substantially compatible and/or substantially compliant signal packets and/or frames. It is noted that there are several versions of the Hypertext Transfer Protocol. The term Hypertext Transfer Protocol, HTTP, and/or similar terms are intended to refer to any version, now known and/or to be later developed. It is likewise noted that in various places in this document substitution of the term Internet with the term World Wide Web ("Web") may be made without a significant departure in meaning and may, therefore, also be understood in that manner if the statement would remain correct with such a substitution.

Although claimed subject matter is not in particular limited in scope to the Internet and/or to the Web; nonetheless, the Internet and/or the Web may without limitation provide a useful example of an embodiment at least for purposes of illustration. As indicated, the Internet and/or the Web may comprise a worldwide system of interoperable networks, including interoperable devices within those networks. The Internet and/or Web has evolved to a self-sustaining facility accessible to potentially billions of people or more worldwide. Also, in an embodiment, and as mentioned above, the terms "WWW" and/or "Web" refer to a part of the Internet that complies with the Hypertext Transfer Protocol. The Internet and/or the Web, therefore, in the context of the present disclosure, may comprise a service that organizes stored digital content, such as, for example, text, images, video, etc., through the use of hypermedia, for example. It is noted that a network, such as the Internet and/or Web, may be employed to store electronic files and/or electronic documents.

The term "electronic file" and/or the term "electronic document" or the like are used throughout this document to refer to a set of stored memory states and/or a set of physical signals associated in a manner so as to thereby at least logically form a file (e.g., electronic) and/or an electronic document. That is, it is not meant to implicitly reference a particular syntax, format and/or approach used, for example, with respect to a set of associated memory states and/or a set of associated physical signals. If a particular type of file storage format and/or syntax, for example, is intended, it is referenced expressly. It is further noted an association of memory states, for example, may be in a logical sense and not necessarily in a tangible, physical sense. Thus, although signal and/or state components of a file and/or an electronic document, for example, are to be associated logically, storage thereof, for example, may reside in one or more different places in a tangible, physical memory, in an embodiment.

A Hyper Text Markup Language ("HTML"), for example, may be utilized to specify digital content and/or to specify a format thereof, such as in the form of an electronic file and/or an electronic document, such as a Web page, Web site, etc., for example. An Extensible Markup Language ("XML") may also be utilized to specify digital content and/or to specify a format thereof, such as in the form of an electronic file and/or an electronic document, such as a Web page, Web site, etc., in an embodiment. Of course, HTML and/or XML are merely examples of "markup" languages, provided as non-limiting illustrations. Furthermore, HTML and/or XML are intended to refer to any version, now known and/or to be later developed, of these languages. Likewise, claimed subject matter are not intended to be limited to examples provided as illustrations, of course.

In the context of the present disclosure, the term "Web site" and/or similar terms refer to Web pages that are associated electronically to form a particular collection thereof. Also, in the context of the present disclosure, "Web page" and/or similar terms refer to an electronic file and/or an electronic document accessible via a network, including by specifying a uniform resource locator (URL) for accessibility via the Web, in an example embodiment. As alluded to above, in one or more embodiments, a Web page may comprise digital content coded (e.g., via computer instructions) using one or more languages, such as, for example, markup languages, including HTML and/or XML, although claimed subject matter is not limited in scope in this respect. Also, in one or more embodiments, application developers may write code (e.g., computer instructions) in the form of JavaScript (or other programming languages), for example, executable by a computing device to provide digital content to populate an electronic document and/or an electronic file in an appropriate format, such as for use in a particular application, for example. Use of the term "JavaScript" and/or similar terms intended to refer to one or more particular programming languages are intended to refer to any version of the one or more programming languages identified, now known and/or to be later developed. Thus, JavaScript is merely an example programming language. As was mentioned, claimed subject matter is not intended to be limited to examples and/or illustrations.

As was indicated, in the context of the present disclosure, the terms "entry," "electronic entry," "document," "electronic document," "content", "digital content," "item," "object," and/or similar terms are meant to refer to signals and/or states in a physical format, such as a digital signal and/or digital state format, e.g., that may be perceived by a user if displayed, played, tactilely generated, etc. and/or otherwise executed by a device, such as a digital device, including, for example, a computing device, but otherwise might not necessarily be readily perceivable by humans (e.g., if in a digital format). Likewise, in the context of the present disclosure, digital content provided to a user in a form so that the user is able to readily perceive the underlying content itself (e.g., content presented in a form consumable by a human, such as hearing audio, feeling tactile sensations and/or seeing images, as examples) is referred to, with respect to the user, as "consuming" digital content, "consumption" of digital content, "consumable" digital content and/or similar terms. For one or more embodiments, an electronic document and/or an electronic file may comprise a Web page of code (e.g., computer instructions) in a markup language executed or to be executed by a computing and/or networking device, for example. In another embodiment, an electronic document and/or electronic file may comprise a portion and/or a region of a Web page. However, claimed subject matter is not intended to be limited in these respects.

Also, for one or more embodiments, an electronic document and/or electronic file may comprise a number of components. As previously indicated, in the context of the present disclosure, a component is physical, but is not necessarily tangible. As an example, components with reference to an electronic document and/or electronic file, in one or more embodiments, may comprise text, for example, in the form of physical signals and/or physical states (e.g., capable of being physically displayed and/or maintained as a memory state in a tangible memory). Typically, memory states, for example, comprise tangible components, whereas physical signals are not necessarily tangible, although signals may become (e.g., be made) tangible, such as if appearing on a tangible display, for example, as is not uncommon. Also, for one or more embodiments, components with reference to an electronic document and/or electronic file may comprise a graphical object, such as, for example, an image, such as a digital image, and/or sub-objects, including attributes thereof, which, again, comprise physical signals and/or physical states (e.g., capable of being tangibly displayed and/or maintained as a memory state in a tangible memory). In an embodiment, digital content may comprise, for example, text, images, audio, video, haptic content and/or other types of electronic documents and/or electronic files, including portions thereof, for example.

Also, in the context of the present disclosure, the term parameters (e.g., one or more parameters) refer to material descriptive of a collection of signal samples, such as one or more electronic documents and/or electronic files, and exist in the form of physical signals and/or physical states, such as memory states. For example, one or more parameters, such as referring to an electronic document and/or an electronic file comprising an image, may include, as examples, time of day at which an image was captured, latitude and longitude of an image capture device, such as a camera, for example, etc. In another example, one or more parameters relevant to digital content, such as digital content comprising a technical article, as an example, may include one or more authors, for example. Claimed subject matter is intended to embrace meaningful, descriptive parameters in any format, so long as the one or more parameters comprise physical signals and/or states, which may include, as parameter examples, collection name (e.g., electronic file and/or electronic document identifier name), technique of creation, purpose of creation, time and date of creation, logical path if stored, coding formats (e.g., type of computer instructions, such as a markup language) and/or standards and/or specifications used so as to be protocol compliant (e.g., meaning substantially compliant and/or substantially compatible) for one or more uses, and so forth.

Signal packet communications and/or signal frame communications, also referred to as signal packet transmissions and/or signal frame transmissions (or merely "signal packets" or "signal frames"), may be communicated between nodes of a network, where a node may comprise one or more network devices and/or one or more computing devices, for example. As an illustrative example, but without limitation, a node may comprise one or more sites employing a local network address, such as in a local network address space. Likewise, a device, such as a network device and/or a computing device, may be associated with that node. It is also noted that in the context of this disclosure, the term "transmission" is intended as another term for a type of signal communication that may occur in any one of a variety of situations. Thus, it is not intended to imply a particular directionality of communication and/or a particular initiating end of a communication path for the "transmission" communication. For example, the mere use of the term in and of itself is not intended, in the context of the present disclosure, to have particular implications with respect to the one or more signals being communicated, such as, for example, whether the signals are being communicated "to" a particular device, whether the signals are being communicated "from" a particular device, and/or regarding which end of a communication path may be initiating communication, such as, for example, in a "push type" of signal transfer or in a "pull type" of signal transfer. In the context of the present disclosure, push and/or pull type signal transfers are distinguished by which end of a communications path initiates signal transfer.

Thus, a signal packet and/or frame may, as an example, be communicated via a communication channel and/or a communication path, such as comprising a portion of the Internet and/or the Web, from a site via an access node coupled to the Internet or vice-versa. Likewise, a signal packet and/or frame may be forwarded via network nodes to a target site coupled to a local network, for example. A signal packet and/or frame communicated via the Internet and/or the Web, for example, may be routed via a path, such as either being "pushed" or "pulled," comprising one or more gateways, servers, etc. that may, for example, route a signal packet and/or frame, such as, for example, substantially in accordance with a target and/or destination address and availability of a network path of network nodes to the target and/or destination address. Although the Internet and/or the Web comprise a network of interoperable networks, not all of those interoperable networks are necessarily available and/or accessible to the public.

In the context of the particular disclosure, a network protocol, such as for communicating between devices of a network, may be characterized, at least in part, substantially in accordance with a layered description, such as the so-called Open Systems Interconnection (OSI) seven layer type of approach and/or description. A network computing and/or communications protocol (also referred to as a network protocol) refers to a set of signaling conventions, such as for communication transmissions, for example, as may take place between and/or among devices in a network. In the context of the present disclosure, the term "between" and/or similar terms are understood to include "among" if appropriate for the particular usage and vice-versa. Likewise, in the context of the present disclosure, the terms "compatible with," "comply with" and/or similar terms are understood to respectively include substantial compatibility and/or substantial compliance.

A network protocol, such as protocols characterized substantially in accordance with the aforementioned OSI description, has several layers. These layers are referred to as a network stack. Various types of communications (e.g., transmissions), such as network communications, may occur across various layers. A lowest level layer in a network stack, such as the so-called physical layer, may characterize how symbols (e.g., bits and/or bytes) are communicated as one or more signals (and/or signal samples) via a physical medium (e.g., twisted pair copper wire, coaxial cable, fiber optic cable, wireless air interface, combinations thereof, etc.). Progressing to higher-level layers in a network protocol stack, additional operations and/or features may be available via engaging in communications that are substantially compatible and/or substantially compliant with a particular network protocol at these higher-level layers. For example, higher-level layers of a network protocol may, for example, affect device permissions, user permissions, etc.

A network and/or sub-network, in an embodiment, may communicate via signal packets and/or signal frames, such via participating digital devices and may be substantially compliant and/or substantially compatible with, but is not limited to, now known and/or to be developed, versions of any of the following network protocol stacks: ARCNET, AppleTalk, ATM, Bluetooth, DECnet, Ethernet, FDDI, Frame Relay, HIPPI, IEEE 1394, IEEE 802.11, IEEE-488, Internet Protocol Suite, IPX, Myrinet, OSI Protocol Suite, QsNet, RS-232, SPX, System Network Architecture, Token Ring, USB, and/or X.25. A network and/or sub-network may employ, for example, a version, now known and/or later to be developed, of the following: TCP/IP, UDP, DECnet, NetBEUI, IPX, AppleTalk and/or the like. Versions of the Internet Protocol (IP) may include IPv4, IPv6, and/or other later to be developed versions.

Regarding aspects related to a network, including a communications and/or computing network, a wireless network may couple devices, including client devices, with the network. A wireless network may employ stand-alone, ad-hoc networks, mesh networks, Wireless LAN (WLAN) networks, cellular networks, and/or the like. A wireless network may further include a system of terminals, gateways, routers, and/or the like coupled by wireless radio links, and/or the like, which may move freely, randomly and/or organize themselves arbitrarily, such that network topology may change, at times even rapidly. A wireless network may further employ a plurality of network access technologies, including a version of Long Term Evolution (LTE), WLAN, Wireless Router (WR) mesh, 2nd, 3rd, or 4th generation (2G, 3G, or 4G) cellular technology and/or the like, whether currently known and/or to be later developed. Network access technologies may enable wide area coverage for devices, such as computing devices and/or network devices, with varying degrees of mobility, for example.

A network may enable radio frequency and/or other wireless type communications via a wireless network access technology and/or air interface, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, ultra-wideband (UWB), IEEE 802.11 (including, but not limited to, IEEE 802.11b/g/n), and/or the like. A wireless network may include virtually any type of now known and/or to be developed wireless communication mechanism and/or wireless communications protocol by which signals may be communicated between devices, between networks, within a network, and/or the like, including the foregoing, of course.

Figure 8:
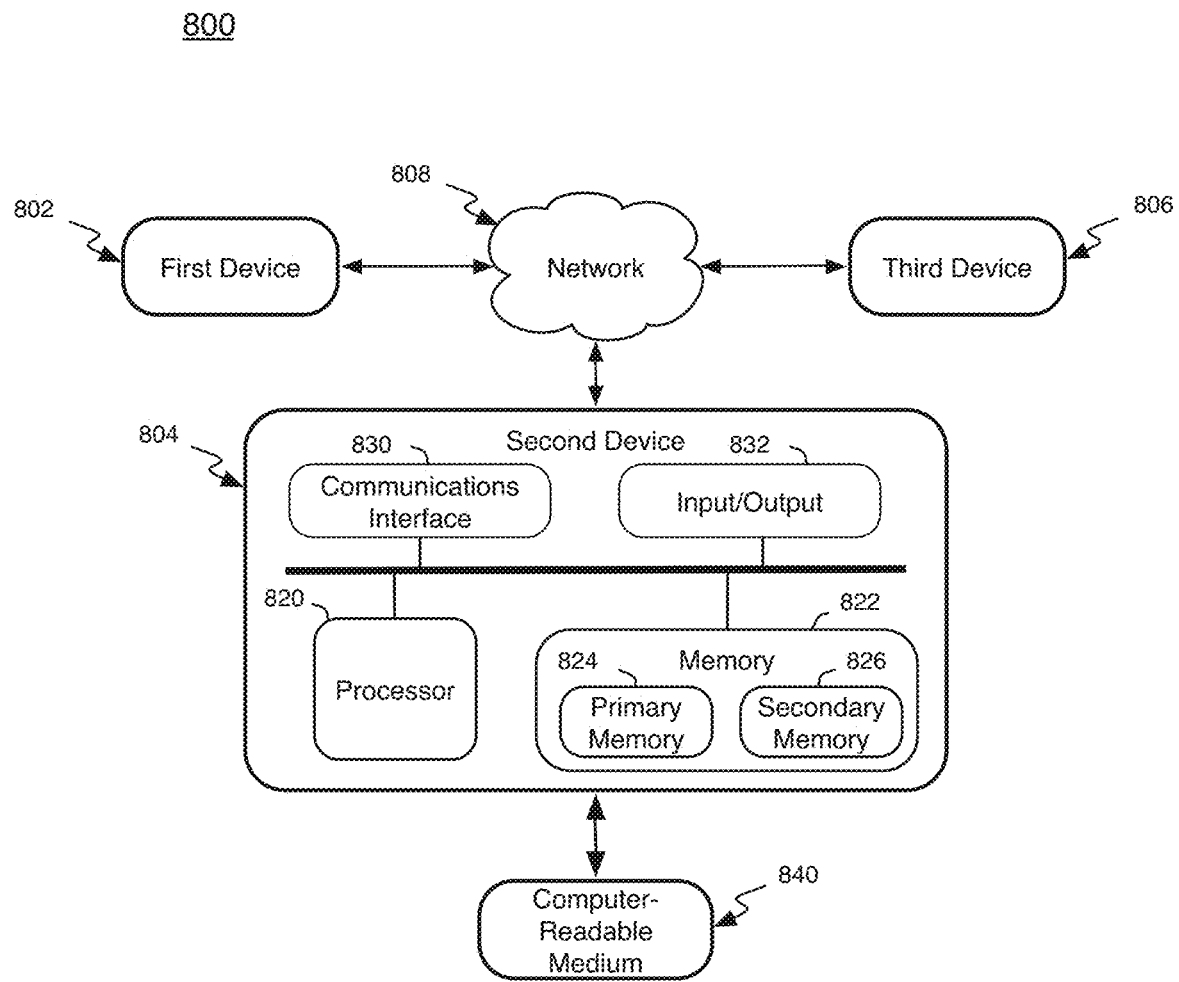
FIG. 8 is a schematic diagram illustrating an implementation of an example computing environment.

In one example embodiment, as shown in FIG. 8, a system embodiment may comprise a local network (e.g., a second device 804 and a computer-readable medium 840) and/or another type of network, such as a computing and/or communications network. For purposes of illustration, therefore, FIG. 8 shows an embodiment 800 of a system that may be employed to implement either type or both types of networks. Network 808 may comprise one or more network connections, links, processes, services, applications, and/or resources to facilitate and/or support communications, such as an exchange of communication signals, for example, between a computing device, such as 802, and another computing device, such as 806, which may, for example, comprise one or more client computing devices and/or one or more server computing device. By way of example, but not limitation, network 808 may comprise wireless and/or wired communication links, telephone and/or telecommunications systems, Wi-Fi networks, Wi-MAX networks, the Internet, a local area network (LAN), a wide area network (WAN), or any combinations thereof.

Example devices in FIG. 8 may comprise features, for example, of a client computing device and/or a server computing device, in an embodiment. It is further noted that the term computing device, in general, whether employed as a client and/or as a server, or otherwise, refers at least to a processor and a memory connected by a communication bus. Likewise, in the context of the present disclosure at least, this is understood to refer to sufficient structure within the meaning of 35 § USC 112 (f) so that it is specifically intended that 35 § USC 112 (f) not be implicated by use of the term "computing device" and/or similar terms; however, if it is determined, for some reason not immediately apparent, that the foregoing understanding cannot stand and that 35 § USC 112 (f) therefore, necessarily is implicated by the use of the term "computing device" and/or similar terms, then, it is intended, pursuant to that statutory section, that corresponding structure, material and/or acts for performing one or more functions be understood and be interpreted to be described at least in FIGS. 1-7 of the present disclosure.

Referring now to FIG. 8, in an embodiment, first and third devices 802 and 806 may be capable of rendering a graphical user interface (GUI) for a network device and/or a computing device, for example, so that a user-operator may engage in system use. Device 804 may potentially serve a similar function in this illustration. Likewise, in FIG. 8, computing device 802 ('first device' in figure) may interface with computing device 804 ('second device' in figure), which may, for example, also comprise features of a client computing device and/or a server computing device, in an embodiment. Processor (e.g., processing device) 820 and memory 822, which may comprise primary memory 824 and secondary memory 826, may communicate by way of a communication bus 815, for example. The term "computing device," in the context of the present disclosure, refers to a system and/or a device, such as a computing apparatus, that includes a capability to process (e.g., perform computations) and/or store digital content, such as electronic files, electronic documents, measurements, text, images, video, audio, etc. in the form of signals and/or states. Thus, a computing device, in the context of the present disclosure, may comprise hardware, software, firmware, or any combination thereof (other than software per se). Computing device 804, as depicted in FIG. 8, is merely one example, and claimed subject matter is not limited in scope to this particular example.

For one or more embodiments, a computing device may comprise, for example, any of a wide range of digital electronic devices, including, but not limited to, desktop and/or notebook computers, high-definition televisions, digital versatile disc (DVD) and/or other optical disc players and/or recorders, game consoles, satellite television receivers, cellular telephones, tablet devices, wearable devices, personal digital assistants, mobile audio and/or video playback and/or recording devices, or any combination of the foregoing. Further, unless specifically stated otherwise, a process as described, such as with reference to flow diagrams and/or otherwise, may also be executed and/or affected, in whole or in part, by a computing device and/or a network device. A device, such as a computing device and/or network device, may vary in terms of capabilities and/or features. Claimed subject matter is intended to cover a wide range of potential variations. For example, a device may include a numeric keypad and/or other display of limited functionality, such as a monochrome liquid crystal display (LCD) for displaying text, for example. In contrast, however, as another example, a web-enabled device may include a physical and/or a virtual keyboard, mass storage, one or more accelerometers, one or more gyroscopes, global positioning system (GPS) and/or other location-identifying type capability, and/or a display with a higher degree of functionality, such as a touch-sensitive color 2D or 3D display, for example.

As suggested previously, communications between a computing device and/or a network device and a wireless network may be in accordance with known and/or to be developed network protocols including, for example, global system for mobile communications (GSM), enhanced data rate for GSM evolution (EDGE), 802.11b/g/n/h, etc., and/or worldwide interoperability for microwave access (WiMAX). A computing device and/or a networking device may also have a subscriber identity module (SIM) card, which, for example, may comprise a detachable or embedded smart card that is able to store subscription content of a user, and/or is also able to store a contact list. A user may own the computing device and/or network device or may otherwise be a user, such as a primary user, for example. A device may be assigned an address by a wireless network operator, a wired network operator, and/or an Internet Service Provider (ISP). For example, an address may comprise a domestic or international telephone number, an Internet Protocol (IP) address, and/or one or more other identifiers. In other embodiments, a computing and/or communications network may be embodied as a wired network, wireless network, or any combinations thereof.

A computing and/or network device may include and/or may execute a variety of now known and/or to be developed operating systems, derivatives and/or versions thereof, including computer operating systems, such as Windows, iOS, Linux, a mobile operating system, such as iOS, Android, Windows Mobile, and/or the like. A computing device and/or network device may include and/or may execute a variety of possible applications, such as a client software application enabling communication with other devices. For example, one or more messages (e.g., content) may be communicated, such as via one or more protocols, now known and/or later to be developed, suitable for communication of e-mail, short message service (SMS), and/or multimedia message service (MMS), including via a network, such as a social network, formed at least in part by a portion of a computing and/or communications network, including, but not limited to, Facebook, LinkedIn, Twitter, Flickr, and/or Google+, to provide only a few examples. A computing and/or network device may also include executable computer instructions to process and/or communicate digital content, such as, for example, textual content, digital multimedia content, and/or the like. A computing and/or network device may also include executable computer instructions to perform a variety of possible tasks, such as browsing, searching, playing various forms of digital content, including locally stored and/or streamed video, and/or games such as, but not limited to, fantasy sports leagues. The foregoing is provided merely to illustrate that claimed subject matter is intended to include a wide range of possible features and/or capabilities.

In FIG. 8, computing device 802 may provide one or more sources of executable computer instructions in the form physical states and/or signals (e.g., stored in memory states), for example. Computing device 802 may communicate with computing device 804 by way of a network connection, such as via network 808, for example. As previously mentioned, a connection, while physical, may not necessarily be tangible. Although computing device 804 of FIG. 8 shows various tangible, physical components, claimed subject matter is not limited to computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

Memory 822 may comprise any non-transitory storage mechanism. Memory 822 may comprise, for example, primary memory 824 and secondary memory 826, additional memory circuits, mechanisms, or combinations thereof may be used. Memory 822 may comprise, for example, random access memory, read only memory, etc., such as in the form of one or more storage devices and/or systems, such as, for example, a disk drive including an optical disc drive, a tape drive, a solid-state memory drive, etc., just to name a few examples.

Memory 822 may be utilized to store a program of executable computer instructions. For example, processor 820 may fetch executable instructions from memory and proceed to execute the fetched instructions. Memory 822 may also comprise a memory controller for accessing device readable-medium 840 that may carry and/or make accessible digital content, which may include code, and/or instructions, for example, executable by processor 820 and/or some other device, such as a controller, as one example, capable of executing computer instructions, for example. Under direction of processor 820, a non-transitory memory, such as memory cells storing physical states (e.g., memory states), comprising, for example, a program of executable computer instructions, may be executed by processor 820 and able to generate signals to be communicated via a network, for example, as previously described. Generated signals may also be stored in memory, also previously suggested.

Memory 822 may store electronic files and/or electronic documents, such as relating to one or more users, and may also comprise a device-readable medium that may carry and/or make accessible content, including code and/or instructions, for example, executable by processor 820 and/or some other device, such as a controller, as one example, capable of executing computer instructions, for example. As previously mentioned, the term electronic file and/or the term electronic document are used throughout this document to refer to a set of stored memory states and/or a set of physical signals associated in a manner so as to thereby form an electronic file and/or an electronic document. That is, it is not meant to implicitly reference a particular syntax, format and/or approach used, for example, with respect to a set of associated memory states and/or a set of associated physical signals. It is further noted an association of memory states, for example, may be in a logical sense and not necessarily in a tangible, physical sense. Thus, although signal and/or state components of an electronic file and/or electronic document, are to be associated logically, storage thereof, for example, may reside in one or more different places in a tangible, physical memory, in an embodiment.

Algorithmic descriptions and/or symbolic representations are examples of techniques used by those of ordinary skill in the signal processing and/or related arts to convey the substance of their work to others skilled in the art. An algorithm is, in the context of the present disclosure, and generally, is considered to be a self-consistent sequence of operations and/or similar signal processing leading to a desired result. In the context of the present disclosure, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular disclosure, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

Referring again to FIG. 8, processor 820 may comprise one or more circuits, such as digital circuits, to perform at least a portion of a computing procedure and/or process. By way of example, but not limitation, processor 820 may comprise one or more processors, such as controllers, microprocessors, microcontrollers, application specific integrated circuits, digital signal processors, programmable logic devices, field programmable gate arrays, the like, or any combination thereof. In various implementations and/or embodiments, processor 820 may perform signal processing, typically substantially in accordance with fetched executable computer instructions, such as to manipulate signals and/or states, to construct signals and/or states, etc., with signals and/or states generated in such a manner to be communicated and/or stored in memory, for example.

FIG. 8 also illustrates device 804 as including a component 832 operable with input/output devices, for example, so that signals and/or states may be appropriately communicated between devices, such as device 804 and an input device and/or device 804 and an output device. A user may make use of an input device, such as a computer mouse, stylus, track ball, keyboard, and/or any other similar device capable of receiving user actions and/or motions as input signals. Likewise, a user may make use of an output device, such as a display, a printer, etc., and/or any other device capable of providing signals and/or generating stimuli for a user, such as visual stimuli, audio stimuli and/or other similar stimuli.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method, comprising:
   verifying one or more hardware solutions at least in part by:
   electronically determining a search space defined by a first Backus-Naur form (BNF) representation of a computer programming language;
   electronically restricting the search space to implement a target functionality representing patterns of electronic behavior inherent to one or more hardware solutions, including obtaining an extended Backus-Naur form (EBNF) representation substantially similar or functionally equivalent, or a combination thereof, to the first BNF representation and pruning the EBNF representation for the target functionality;
   converting the EBNF representation to a second BNF representation to produce a subset of the first BNF representation focused on the target functionality; and determining whether the one or more hardware solutions are compliant with the first BNF representation defining the search space.

2. The method of claim 1, wherein the search space is defined via a grammar.

3. The method of claim 2, wherein the grammar comprises a context-free grammar.

4. The method of claim 1, wherein the computer programming language comprises a hardware description language (HDL).

5. The method of claim 4, wherein the HDL comprises Verilog.

6. The method of claim 1, further comprising pruning the subset of the first BNF representation focused on the target functionality to implement one or more syntactic constraints in accordance with a particular characteristic of the target functionality.

7. The method of claim 1, further comprising altering one or more rules of the subset of the first BNF representation focused on the target functionality to inject context related to the target functionality.

8. The method of claim 1, further comprising altering one or more rules of the subset of the first BNF representation focused on the target functionality to change a variable name to a constant.

9. The method of claim 1, wherein the determining whether the one or more hardware solutions are compliant with the first BNF representation of the search space includes determining whether the one or more hardware solutions can compile without error.

10. The method of claim 1, wherein the determining whether the one or more hardware solutions are compliant with the first BNF representation of the search space includes determining whether compiled code corresponding to the one or more hardware solutions can be successfully executed.

11. The method of claim 1, wherein the plurality of hardware solutions comprise a plurality of linear feedback shift registers (LFSRs).

12. The method of claim 1, wherein the target functionality comprises a functionality of LFSRs.

13. The method of claim 1, wherein said evolutionary criteria is applied via one or more grammatical evolution operations.

14. The method of claim 13, wherein the one or more grammatical evolution operations are implemented, at least in part, via a grammatical evolution tool.

15. The method of claim 14, wherein the grammatical evolution tool comprises PonyGE2, and wherein the determining whether the one or more hardware solutions are compliant with the first BNF representation of the search space is performed at least in part utilizing PonyGE2.

16. An apparatus comprising:
one or more processors coupled to a memory, the one or more processors to verify one or more hardware solutions, wherein, to verify the one or more hardware solutions, the one or more processors to:
electronically determine a search space to be defined by a first Backus-Naur form (BNF) representation of a computer programming language;
electronically restrict the search space to implement a target functionality to represent patterns of electronic behavior inherent to one or more of hardware solutions, to include the one or more processors to obtain an extended Backus-Naur form (EBNF) representation substantially similar or functionally equivalent, or a combination thereof, to the first BNF representation and prune the EBNF representation for the target functionality;
convert the EBNF representation to a second BNF representation to produce a subset of the first BNF representation focused on the target functionality; and
determine whether the one or more hardware solutions are compliant with the first BNF representation defining the search space.

17. The apparatus of claim 16, wherein, to electronically restrict the search space, the one or more processors further to:
define the evolutionary criteria to encourage the patterns of electronic behavior inherent to the one or more hardware solutions; and
obtain a syntactically correct form of the first BNF representation based, at least in part, on the to be defined evolutionary criteria.

18. The apparatus of claim 16, wherein, to determine whether the one or more hardware solutions are compliant with the first BNF representation of the search space, the one or more processors to compile the one or more hardware solutions to generate compiled code corresponding to the one or more hardware solutions.

19. The apparatus of claim 16, wherein, to determine whether the one or more hardware solutions are compliant with the first BNF representation of the search space, the one or more processors to determine whether compiled code corresponding to the one or more hardware solutions can be successfully executed.

20. An article, comprising: a non-transitory storage medium having stored thereon instructions executable by a computing device to:
verify one or more hardware solutions, wherein, to verify the one or more hardware solutions, the computing device to:
electronically determine a search space to be defined by a first Backus-Naur form (BNF) representation of a computer programming language;
electronically restrict the search space to implement a target functionality to represent patterns of electronic behavior inherent to one or more of hardware solutions, to include the one or more processors to obtain an extended Backus-Naur form (EBNF) representation substantially similar or functionally equivalent, or a combination thereof, to the first BNF representation and prune the EBNF representation for the target functionality;
convert the EBNF representation to a second BNF representation to produce a subset of the first BNF representation focused on the target functionality; and
determine whether the one or more hardware solutions are compliant with the first BNF representation defining the search space.

* * * * *